(12) United States Patent
Tchakarov et al.

(10) Patent No.: US 8,362,686 B2
(45) Date of Patent: Jan. 29, 2013

(54) SUBSTRATE BEARING AN ELECTRODE, ORGANIC LIGHT-EMITTING DEVICE INCORPORATING IT, AND ITS MANUFACTURE

(75) Inventors: Svetoslav Tchakarov, Arcueil (FR); Sophie Besson, Compiègne (FR); Didier Jousse, Taverny (FR); Nathalie Rohaut, Saint Prix (FR)

(73) Assignee: Saint-Gobain Glass France, Courbevoie (FR)

( * ) Notice: Subject to any disclaimer, the term of this patent is extended or adjusted under 35 U.S.C. 154(b) by 0 days.

(21) Appl. No.: 12/744,191

(22) PCT Filed: Nov. 21, 2008

(86) PCT No.: PCT/FR2008/052108
§ 371 (c)(1),
(2), (4) Date: Sep. 7, 2010

(87) PCT Pub. No.: WO2009/071821
PCT Pub. Date: Jun. 11, 2009

(65) Prior Publication Data
US 2011/0001153 A1    Jan. 6, 2011

(30) Foreign Application Priority Data
Nov. 22, 2007 (FR) ...................................... 07 59235

(51) Int. Cl.
*H01L 51/50* (2006.01)
*H01L 51/52* (2006.01)
(52) U.S. Cl. ............................ 313/503; 313/498; 445/23
(58) Field of Classification Search .......... 313/498–512; 445/23–25
See application file for complete search history.

(56) References Cited

U.S. PATENT DOCUMENTS
6,645,645 B1    11/2003    Adachi et al. ................. 428/690
(Continued)

FOREIGN PATENT DOCUMENTS
EP    0 888 035 A    12/1998
WO    WO 2004/025334    3/2004
(Continued)

OTHER PUBLICATIONS

Toki et al., "Sol-Gel Formation of ITO Thin Film From a Sol Including ITO Powder," Journal of Sol-Gel Science and Technology, vol. 8, No. 1/02/03, 1997, pp. 717-720.

(Continued)

*Primary Examiner* — Joseph L Williams
*Assistant Examiner* — Nathaniel Lee
(74) *Attorney, Agent, or Firm* — Pillsbury Winthrop Shaw Pittman LLP

(57) ABSTRACT

A substrate bearing, on one main face, a composite electrode, which includes an electroconductive network which is a layer formed from strands made of an electroconductive material based on a metal and/or a metal oxide, and having a light transmission of at least 60% at 550 nm, the space between the strands of the network being filled by an electroconductive fill material. The composite electrode also includes an electroconductive coating, which may or may not be different from the fill material, covering the electroconductive network, and in electrical connection with the strands, having a thickness greater than or equal to 40 nm, of resistivity $\rho 1$ less than $10^5$ $\Omega \cdot cm$ and greater than the resistivity of the network, the coating forming a smoothed outer surface of the electrode. The composite electrode additionally has a sheet resistance less than or equal to $10\Omega/\square$.

47 Claims, 4 Drawing Sheets

U.S. PATENT DOCUMENTS

| | | | |
|---|---|---|---|
| 7,172,822 B2 | 2/2007 | Shibata | 428/690 |
| 2004/0150326 A1* | 8/2004 | Shibata | 313/503 |
| 2004/0253439 A1 | 12/2004 | Martin et al. | 428/339 |
| 2007/0257608 A1 | 11/2007 | Tyan et al. | 313/506 |
| 2011/0273085 A1* | 11/2011 | Garbar et al. | 313/509 |

FOREIGN PATENT DOCUMENTS

| | | |
|---|---|---|
| WO | WO 2005/008800 | 1/2005 |
| WO | WO 2005008800 A1 * | 1/2005 |
| WO | WO 2008/129199 | 10/2008 |
| WO | WO 2009/071822 | 6/2009 |

OTHER PUBLICATIONS

International Search Report as issued for PCT/FR2008/052108, dated Jun. 25, 2009.

Terrier, et al., "Sb-doped $SnO_2$ transparent conducting oxide from the sol-gel dip-coating technique", Thin Solid Films, vol. 263, 1995, pp. 37-41.

Goebbert, et al., "Wet chemical deposition of ATO and ITO coatings using crystalline nanoparticles redispersable in solutions", Thin Solid Films, vol. 351, 1999, pp. 79-84.

Lee, et al., "Transparent conducting ZnO:Al, In and Sn thin films deposited by the sol-gel method", Thin Solid Films, vol. 426, 2003, pp. 94-99.

Lee, et al., "Electrical and optical properties of $In_2O_3$—Zno thin films prepared by sol-gel method", Thin Solid Films, vol. 484, 2005, pp. 184-187.

Luna-Arredondo, et al., "Indium-doped ZnO thin films deposited by the sol-gel technique", Thin Solid Films, vol. 490, 2005, pp. 132-136.

Kim, et al., "Preparation and Characterization of IZO Transparent Conducting Films by Sol-gel Method", Materials Science Forum, vols. 449-452, 2004, pp. 469-472.

Kaur, et al., "Sol-gel derived highly transparent and conducting yttrium doped ZnO films", Journal of Non-Crystalline Solids, vol. 352, 2006, pp. 2335-2338.

Kaur, et al., "Development of highly transparent and conducting yttrium-doped ZnO films: the role of sol-gel stabilizers", Materials Science-Poland, vol. 22, No. 3, 2004, pp. 201-209.

Tahar, et al, "Boron-doped zinc oxide thin films prepared by sol-gel technique", Journal of Materials Science, vol. 40, 2005, pp. 5285-5289.

Paul, et al., "Structural, optical and electrical studies on sol-gel deposited Zr doped ZnO films", Materials Chemistry and Physics, vol. 79, 2003, pp. 71-75.

Jang, et al., "Synthesis and characterization of indium-tin oxide (ITO) nanoparticles", Current Applied Physics, vol. 6, 2006, pp. 1044-1047.

Al-Dahoudi, et al., "Conducting, Antistatic and Antistatic-Antiglare Coatings made with Hybrid Sols", Mol. Cryst. Liq. Cryst., vol. 374, 2002, pp. 91-100.

Daoudi, Kaïs, Thesis titled "Élaboration et Caracterisation de Films Minces D'Oxyde D'Indium Dope a l'Etain Obtenus par Vole Sol-Gel", order No. 58/2003, presented on May 20, 2003 before Université Claude Bernard Lyon 1 in Lyon, France.

* cited by examiner

SUBSTRATE BEARING AN ELECTRODE, ORGANIC LIGHT-EMITTING DEVICE INCORPORATING IT, AND ITS MANUFACTURE

CROSS-REFERENCE TO RELATED APPLICATIONS

This application is the U.S. National Stage of PCT/FR2008/052108, filed Nov. 21, 2008, which in turn claims priority to French Application No. 0759235, filed Nov. 22, 2007. The content of both applications are incorporated herein by reference in their entirety.

The subject of the present invention is a substrate bearing an electrode, the organic light-emitting device incorporating it, and its manufacture.

Known organic light-emitting systems or OLEDs (organic light-emitting diodes) comprise an organic electroluminescent material or a stack of such materials supplied with electricity by electrodes flanking it in the form of electroconductive layers.

Conventionally, the upper electrode is a reflective metal layer, for example made of aluminium, and the lower electrode is a transparent layer based on indium oxide, generally tin-doped indium oxide better known by the abbreviation ITO, with a thickness of around 100 to 150 nm. However, for uniform illumination over large areas, it is necessary to form a discontinuous lower electrode, typically by forming electrode zones of a few mm$^2$, and to drastically reduce the distance between each electrode zone, typically by around ten microns. Use is made of expensive and complex photolithography and passivation techniques.

Document U.S. Pat. No. 7,172,822 furthermore proposes an OLED device, of which the electrode nearest to the substrate comprises an irregular network conductor obtained by filling a cracked mask. More specifically, between the glass substrate and the OLED active layer, the OLED device successively comprises:

a gold-based sublayer;
 a sol-gel layer, that forms the microcracked mask after annealing, having a thickness equal to 0.4 µm;
 the gold-based network conductor, obtained by catalytic deposition, this network conductor having a sheet resistance equal to 3Ω/□, and a light transmission of 83%;
 a 50 nm poly(3,4-ethylenedioxythiophene) layer.

FIG. 3 from this document U.S. Pat. No. 7,172,822 reveals the morphology of the silica sol-gel mask. It appears in the form of fine crack lines oriented along a preferred direction, with bifurcations characteristic of the fracture phenomenon of an elastic material. These main crack lines are occasionally joined together by the bifurcations.

The domains between the crack lines are asymmetric with two characteristic dimensions: one parallel to the crack propagation direction between 0.8 and 1 mm, the other perpendicular between 100 and 200 µm.

This electrode has acceptable electroconductive and transparency properties, the sheet resistance being equal to 3Ω/□ and the light transmission of 82%. However, the reliability of the OLED device with such an electrode is not ensured.

To form the cracked sol-gel mask, a sol based on water, alcohol and a silica precursor (TEOS) was deposited, the solvent was evaporated and it was annealed at 120° C. for 30 minutes.

This process for manufacturing an electrode by cracking of the sol-gel mask constitutes progress for the manufacture of a network conductor by eliminating, for example, recourse to photolithography (exposure of a resist to radiation/a beam and development), but may still be improved, especially in order to be compatible with industrial requirements (reliability, simplification and/or reduction of the manufacturing steps, reduced cost, etc.).

It can also be observed that the process for manufacturing the network inevitably requires the deposition of a (chemically or physically) modifiable sublayer at the openings in order to either allow a favoured adhesion (of metal colloids, for example) or else to allow catalyst grafting for metal post-growth, this sublayer therefore having a functional role in the growth process of the network.

Furthermore, the profile of the cracks is V-shaped due to the fracture mechanics of the elastic material, which involves the use of a post-mask process in order to make the metallic network grow starting from colloidal particles located at the base of the V.

The objective of the invention is to obtain an electrode for an OLED of high performances (high conductivity, suitable transparency) which is reliable, robust, reproducible, that can be produced over large areas, all this on an industrial scale and preferably at a lower cost and as easily as possible. Preferably, this electrode also contributes to the increase in the overall performances of the OLED device (light output, uniformity of illumination, etc.).

For this purpose, a first subject of the present invention is a substrate bearing, on one main face, a composite electrode, which comprises:

an electroconductive network formed from strands which is a layer (single layer or multilayer) made of electroconductive material(s) based on a metal and/or a metal oxide, the network having a light transmission of at least 60% at 550 nm, or even an integrated light transmission $T_L$ of at least 60%, the space between the strands being filled by a material referred to as a fill material;
 an electroconductive coating covering the electroconductive network, having a thickness greater than or equal to 40 nm, and in electrical connection with the strands, of resistivity $\rho 1$ less than $10^5$ Ω·cm and greater than the resistivity of the material that forms the strands of the network, the coating forming a smoothed outer surface of the electrode;
 the fill material being electroconductive with a resistivity $\rho 2$ greater than the resistivity of the network $\rho 0$ and less than the resistivity $\rho 1$, or with a resistivity $\rho 2$ greater than $\rho 1$, having a thickness greater than the thickness of the strands, the electroconductive coating then covering said fill material, or the fill material being made of said electroconductive material, the electroconductive coating then substantially filling the space between the strands;
 the composite electrode also having a sheet resistance less than or equal to 10Ω/□.

The composite electrode according to the invention thus comprises an electroconductive network that is buried (by the fill material, which may or may not be different from the electroconductive coating), the surface of which is smoothed to avoid introducing electrical defects into the OLEDs.

The surface of the electroconductive coating is the outer surface of the electrode. The surface of the electroconductive coating may be intended preferably to be in contact with the organic layers of the OLED: in particular the hole injection layer (HIL) and/or the hole transport layer (HTL).

The electroconductive fill material eliminates, in particular, the difference between the top level and the bottom level of the electrode network.

Through the electroconductive coating, the risks of short circuits generated by spike effects resulting from an uncontrolled surface microroughness of the strands (coated by the fill material) and/or of the surface of the electroconductive fill material between the strands are eliminated.

The electroconductive coating according to the invention may or may not be in direct contact with the strands. Either it is separated from the strands by the different electroconductive fill material, in overthickness compared to the height of the strands. Or it is in contact with the strands when the fill material is made of the material of the coating. The surface of the fill material then straightaway forms the smoothed surface of the electrode.

Through the sufficiently smooth electroconductive fill material, or electroconductive fill material of controlled roughness, it is thus possible to contribute to the elimination of the risks of short circuits generated by spike effects. Thus, the surface of the fill material may form a first smoothing level and the surface of the different electroconductive coating a second finer smoothing level. The electroconductive coating according to the invention thus makes it possible to smooth the surface of the network coated with the different electroconductive fill material even more.

On the contrary, the network conductor described in document U.S. Pat. No. 7,172,822 is covered with a thin polymer layer which matches the difference in height between the network conductor and the cracked mask.

Through this design of a buried and smoothed network electrode according to the invention, the reliability and reproducibility of the OLEDs are thus guaranteed, and its service life is thus prolonged.

The invention thus relates, starting from an electrode made of a network of strands which may be relatively thick and/or spaced out, to controlling the roughness of the electrode on several levels (firstly by burying the network using the fill material in order to suppress abrupt steps and then by smoothing it sufficiently) and to ensuring electrical and transparency properties that are suitable for an electrode made of several materials (strand material(s), fill material that may or may not be different from the electroconductive coating) or even to improve the performance of the OLED.

The electroconductive fill material may be single-component or multicomponent, single-layer or multilayer.

The fill material may advantageously preferably have at least one of the following functions:

have a role of smoothing the surface of the electrode, in particular by choosing a smooth material (via a judicious choice of the deposition method, of its formulation, of its thickness), as already indicated;

have an electrical role in combination with the electroconductive coating, due to its electroconductive nature;

be a means of extracting the radiation emitted by the OLED.

The electroconductive coating according to the invention, due to its resistivity, its covering of the network and its covering of the different electroconductive fill material, and due to its thickness, maintains a sufficient vertical conductivity when the fill material is of resistivity $\rho 2$ greater than the resistivity of the network $\rho 0$ and less than the resistivity $\rho 1$ in order to avoid the losses of light output through an increase in series resistance (requiring an increase in the applied DC voltage).

The electroconductive coating according to the invention, due to its resistivity, its covering of the network and its covering of the different electroconductive fill material, and due to its thickness, contributes to a better distribution of the current, when the fill material is electroconductive, having a resistivity $\rho 2$ greater than $\rho 1$.

The resistivity of the electroconductive coating $\rho 1$ may be less than or equal to $10^3 \Omega \cdot cm$, and even less than or equal to $10^2 \Omega \cdot cm$.

The network may be in the form of lines, for example parallel lines, or else in the form of closed patterns (strands interconnected to one another, defining meshes), for example geometrical (rectangular, square, polygonal, etc.) closed patterns and optionally patterns of irregular shape and/or of irregular size.

It is possible to define B as the average distance between the strands (in particular corresponding to an average mesh size), A as the average width of the strands, and B+A as the average period of the optionally irregular network.

The shorter the average distance B between strands (dense network), the higher the resistivity $\rho 1$ of the electroconductive coating may be. Moreover, since the fill material is electroconductive, the resistivity $\rho 1$ of the electroconductive coating may be relatively large.

In a first configuration, the fill material is electroconductive, for example with a resistivity $\rho 2$ less than or equal to $10^3 \Omega \cdot cm$, preferably with a fill thickness greater than or equal to half the height of the strands, in particular greater than or equal to 200 nm. The resistivity $\rho 1$ may then preferably be less than or equal to $10^3 \Omega \cdot cm$.

In a second configuration, the fill material is not very conductive. The resistivity $\rho 1$ may then preferably be less than or equal to $10^{-1} \Omega \cdot cm$ in particular when the network is dense (B typically less than or equal to 50 µm). When the network is not very dense (B typically greater than 50 µm), the resistivity $\rho 1$ may then more preferably still be less than or equal to $10^{-2} \Omega \cdot cm$, or even less than or equal to $10^{-4} \Omega \cdot cm$.

The resistivity $\rho 1$ may possibly be at least ten times greater than $\rho 2$ to reduce the sensitivity to short circuits.

The surface of the electrode according to the invention is not necessarily planar, planarized by the coating. It may be rippled.

Specifically, the electroconductive coating may smooth the surface firstly by forming undulations that are sufficiently spread out. It is thus important to eliminate sharp angles, steep gaps. Preferably, the outer surface is such that, starting from an actual profile of the outer surface over the average period of the network B+A and by forming a corrected profile by nanoscale filtering to eliminate the local microroughness, an angle formed by the tangent to the corrected profile with the average plane of the corrected (or actual) profile is obtained that is less than or equal to 45°, more preferably still less than or equal to 30°, at any point of the corrected profile.

For these angle measurements it is possible to use an atomic force microscope. An image of the actual surface is formed over a squared period $(A+B)^2$ of the network. This image or a section of this image thus forming the actual profile of the surface along a given axis is exploited. The analysis length A+B for the profile is judicious since it clearly reflects the profile of the roughness. The average period of the network B+A is typically submillimetric, preferably between 10 µm and 500 µm.

The actual profile is corrected by taking (at any point) a moving average on the scale between 50 and 200 nm, for example 100 nm, and then, for each point, the angle between the mid-plane and the tangent to the profile is determined. This nanoscale filtering thus serves firstly to dismiss the irregularities short-scale.

It is not however sufficient to soften the surface without limiting the local microroughnesses in order to prevent short circuits as much as possible.

Thus, the residual profile is used, that is to say the actual profile minus the corrected profile. The residual profile may thus have a maximum height difference between the highest point and the lowest point ("peak-to-valley" parameter) of less than 50 nm, more preferably still less than or equal to 20 nm, or even 10 nm, over the average period of the network B+A.

The residual profile may also have an RMS roughness parameter less than or equal to 50 nm, even 20 nm (otherwise known as Rq), or even 5 nm over the average period of the network B+A.

RMS stands for "Root Mean Square" roughness. It is a measurement that consists in measuring the value of the root mean square deviation of the roughness. The RMS parameter, in concrete terms, therefore quantifies on average the height of the peaks and valleys of residual roughness (local microroughness), compared to the average (residual) height. Thus, an RMS of 10 nm signifies a double peak amplitude.

Naturally, the limit conditions on the angles and the residual microroughness may preferably be satisfied over the majority of the electrode surface. To verify this, it is possible to take the measurements over various zones spread (uniformly) over the entire surface.

It is preferred to take these measurements in the active zones of the electrode, certain zones, such as for example the edges of the electrode, possibly being passivated for example for the connection system or to form several luminous zones.

The angle measurements may also be taken in another manner by a mechanical stylus system (using, for example, the measurement instruments sold by Veeco under the name DEKTAK).

The outer surface of the electroconductive coating may also have very large scale undulations, typically over one or more millimeters. Furthermore, the substrate, and consequently the outer surface, may be curved.

The light transmission of the network depends on the ratio B/A of the average distance between the strands B to the average width of the strands A.

Preferably, the ratio B/A is between 5 and 15, more preferably still around 10, to easily retain the transparency and facilitate the fabrication. For example, B and A are respectively equal to around 300 µm and 30 µm, 100 µm and 10 µm, 50 µm and 5 µm, or 20 µm and 2 µm.

In particular, an average width of strands A is chosen that is less than 30 µm, typically between 100 nm and 30 µm, preferably less than or equal to 10 µm, or even 5 µm to limit their visibility and greater than or equal to 1 µm to facilitate the fabrication and to easily retain high conductivity and transparency. The preferred range is between 1 and 10 µm.

In particular, it is also possible to choose an average distance between strands B that is greater than A, between 5 µm and 300 µm, even between 20 and 100 µm, or even less than 50 µm to easily retain the transparency.

Since the network may be irregular and/or the edges of the strands may be sloping, the dimensions A and B are therefore average dimensions.

The average thickness of the strands may be between 100 nm and 5 µm, more preferably still from 0.5 to 3 µm, or even between 0.5 and 1.5 µm to easily retain transparency and high conductivity.

Advantageously, the composite electrode according to the invention may have:
  a sheet resistance less than or equal to 5 Ω/□, even less than or equal to 1 Ω/□, or even 0.5 Ω/□ in particular for a network thickness (even a total electrode thickness) greater than or equal to 1 µm, and preferably less than 10 µm, even less than or equal to 5 µm;
  and/or a light transmission $T_L$ greater than or equal to 50%, more preferably still greater than or equal to 70%.

The composite electrode according to the invention may be used for a bottom emission organic light-emitting device or for a bottom and top emission organic light-emitting device.

The light transmission $T_L$ may be, for example, measured on a substrate having a $T_L$ of around 90% or even higher, for example a soda-lime-silica glass.

The composite electrode according to the invention may be over a large area, for example an area greater than or equal to 0.02 m² or even greater than or equal to 0.5 m² or 1 m².

Furthermore, a deposition, even a thick deposition, of an electroconductive material may cover the strands without sufficiently smoothing the surface. This is because chemical vapour deposition (CVD) or physical vapour deposition (PVD) techniques, in particular deposition under vacuum (evaporation, sputtering) reproduce or even amplify the irregularities of the initial, surface. Then, to obtain a smoothed outer surface, it is then necessary to carry out a subsequent surfacing operation of an electroconductive material, for example via a mechanical (polishing type) action.

Also, preferably, for the electroconductive coating according to the invention, even for the fill material too, a liquid route deposition technique is chosen, in particular at least one of the following techniques: by (flat, rotary, etc.) printing, in particular by flexographic printing, by etch printing or else by spray coating, by dip coating, by curtain coating, by flow coating, by spin-coating, by blade coating, by wire-bar coating, by other coating, by ink-jet printing, or by screen-printing. The deposition may also be obtained by a sol-gel route.

Specifically, the surface tension of a liquid film tends to smooth the surface irregularities.

On top of the strands, the thickness of the electroconductive coating, alone or combined with a subjacent electroconductive layer made of the different fill material, may be between 40 and 1000 nm and preferably between 50 and 500 nm.

The electroconductive coating and/or the optionally different electroconductive fill material may, for example, comprise or be composed of a TCO (transparent conductive oxide) layer.

For the electroconductive coating, it is possible to preferably choose the single oxides of tin $SnO_2$, of zinc ZnO, of indium $In_2O_3$ and also doped oxides, even mixed binary or ternary oxides, in particular of one or more of the aforementioned elements. In particular, at least one of the following doped or mixed oxides is preferred:
  zinc oxide doped or alloyed with at least one of the following elements: aluminium, gallium, indium, boron, tin (for example ZnO:Al, ZnO:Ga, ZnO:In, ZnO:B, ZnSnO);
  indium oxide doped or alloyed in particular with zinc (IZO), gallium and zinc (IGZO) or tin (ITO);
  tin oxide doped with fluorine or with antimony ($SnO_2$:F, $SnO_2$:Sb) or alloyed with zinc (SnZnO) optionally doped with antimony;
  titanium oxide doped with niobium ($TiO_2$:Nb).

For the electroconductive fill material, it is also possible to choose the aforementioned electroconductive materials or materials of other oxides in particular high index, electrically insulating (filled with electronductive particles, in particular metallic particles or particles of transparent conductive oxide(s)) materials, in particular:
  niobium oxide ($Nb_2O_5$);
  zirconium oxide ($ZrO_2$);
  titanium oxide ($TiO_2$);
  alumina ($Al_2O_3$);
  tantalum oxide ($Ta_2O_5$);

or else nitrides such as $Si_3N_4$, AlN, GaN, optionally doped with Zr, or else the stoichiometric silicon carbide SiC.

This electroconductive and high index fill layer may be produced, for example, by PVD or CVD deposition.

The electroconductive coating may, for example, comprise a layer containing metallic nanoparticles or nanoparticles of transparent conductive oxide(s), as mentioned above, preferably between 10 and 50 nm to better limit and control the roughness of the deposition, the nanoparticles optionally and preferably in a binder.

The fill material may comprise or even be composed of a mainly inorganic or hybrid organic/inorganic layer.

The fill material may, for example, comprise or even be composed of a sol-gel layer in particular based on single or mixed conductive metal oxide(s) such as those mentioned above. However, it is tricky to obtain thick sol-gel layers, in particular having a thickness greater than 200 nm or even 150 nm and in particular in one go.

Preferably, the fill material optionally different from the electroconductive coating may comprise or be composed of a layer containing metallic (nano)particles or (nano)particles of conductive oxide(s) as mentioned above.

The (nano)particles are preferably sized between 10 and 50 nm to better limit and control the roughness of the deposition and preferably to prepare the smoothing via a superjacent electroconductive coating. The (nano)particles are optionally in a binder.

As metallic (nano)particles, it is possible to choose (nano) particles based on Ag, Au, Al, Pd, Pt, Cr or Cu. The resistivity and the transparency are adjusted for the concentration of (nano)particles in a binder.

As (nano)particles of transparent conductive oxide(s) the following are, in particular, preferred:

indium oxide doped with tin $SnO_2$:I (ITO)
$SnO_2$:Sb (ATO)

The composite electrode preferably has a limited ITO content for cost reasons. For example, an ITO sol-gel layer based on organometallic precursors has a maximum thickness of 150 nm, or even of 50 nm.

The nanoparticles may be deposited from a dispersion in a solvent (alcohol, ketone, water, glycol, etc.).

Commercial products based on particles which may be used to form the fill layer (or even the electroconductive coating) are the following products sold by Sumitomo Metal Mining Co. Ltd.:

X100®, X100®D ITO particles dispersed in a(n) (optional) resin binder and with ketone solvent;
X500® ITO particles dispersed in an alcohol solvent;
CKR® gold-coated silver particles in an alcohol solvent;
CKRF® agglomerated gold and silver particles.

The dispersions alone are not very mechanically resistant due to the absence of binder between the particles. Therefore, in order to ensure a better cohesion of the layer, it is preferred to mix them into a binder before their deposition (binder then spread over the entire thickness of the fill layer).

The binder may be electrically insulating or electroconductive.

The binder may be organic, for example acrylic, epoxy or polyurethane resins.

The electroconductive or electrically insulating binder may be, for example, $ZrO_2$, $TiO_2$ It may be produced via a sol-gel route (mineral, or hybrid organic/inorganic, etc.). The binder may be based on organometallic precursors, preferably of the same chemical nature as the nanoparticles of conductive metal oxides.

The resistivity desired for the coating and/or for the fill layer is adjusted as a function of the formulation.

Another alternative is to cover the fill layer based on nanoparticles without binder with an electroconductive binder. The binder penetrates between the nanoparticles (at least over the outermost part of the fill layer) thus acting as cement between the particles, for example at least over half the thickness (typically more than several hundreds of nm). Furthermore, the binder that remains at the surface then forms the electroconductive coating that smoothes the surface and that may protect the fill layer from mechanical attacks.

Again, the electroconductive binder may be:
a mineral or hybrid mineral/organic binder, in particular a sol-gel based on organometallic precursors, preferably of the same chemical nature as the nanoparticles of metal oxides;
or an organic or polymer binder.

The process for depositing the fill layer may be, for example, by spin coating or spray coating or else by screen printing.

Therefore, the electroconductive coating may comprise or even be composed of a mainly inorganic or hybrid organic/inorganic layer, for example a sol-gel layer in particular based on single or mixed conductive metal oxides such as those mentioned above.

This layer preferably has a thickness less than or equal to 200 nm, in particular when it is a sol-gel layer (especially for preventing cracks due to high stresses in the layer).

Sol-gels have the advantage of withstanding even high heat treatments (for example, dip-coating type operation) and of being resistant to UV exposure.

To fabricate a sol-gel layer, commercially available precursors of transparent conductive oxides are preferably chosen, in particular precursors of organometallic compounds or of salts of these metals.

Thus, as examples of precursors for tin oxide coatings, $SnCl_4$, sodium stannate, $SnCl_2(OAc)_2$ or an Sn(IV) alkoxide such as $Sn(OtBu)_4$ may be chosen. It is also possible to choose any organometallic compound or salt known as being a tin precursor.

For antimony oxide depositions, organometallic compounds and salts, in particular alkoxides of Sb(III) and chlorides such as $SbCl_3$ or $SbCl_5$ may be chosen.

Mixed and/or doped oxide layers are obtained, for example, by mixing the precursors in the appropriate proportions and by using solvents compatible with said precursors.

For example, an antimony-doped tin oxide layer may be obtained from tin chloride and from antimony chloride in solution in water, in the presence of urea and hydrochloric acid. Another production example consists in using tin tetraisopropoxide as a precursor in a water/alcohol/ethanolamine mixture and adding antimony chloride as a dopant.

An example of the sol-gel fabrication of an ITO layer is given on pages 19 to 25 of the thesis entitled "ÉLABORATION ET CARACTERISATION DE FILMS MINCES D'OXYDE D'INDIUM DOPE A L'ETAIN OBTENUS PAR VOIE SOL-GEL" [Production and characterization of thin films of tin-doped indium oxide obtained by a sol-gel route] by Kaïs Daoudi, Order No. 58-2003, presented and defended in Lyons on 20 May 2003.

It is also possible to use the product named DX-400® sold by Sumitomo Metal Mining Co. Ltd. This is a paste based on tin and indium alkoxides, on an organic solvent and on a viscosity control agent.

The precursors of the metal oxides of alkoxide type are used, for example, diluted in an organic solvent, for example a volatile alcohol. As volatile alcohols, it is possible to choose linear or branched C1 to C10 or 15 alcohols, in particular, methanol, ethanol, hexanol, isopropanol, or else glycols, in particular ethylene glycol or else volatile esters such as ethyl acetate.

The composition used for depositing the sol-gel layer may advantageously also comprise other constituents, in particular water as a hydrolysis agent, or a stabilizer such as diacetone alcohol, acetylacetone, acetic acid or formamide.

In particular, the precursors of metal salt type are generally used in solution in water. The pH of the water may be adjusted by using acids or bases (for example, hydrochloric acid, acetic acid, ammonium hydroxide, sodium hydroxide) to control the condensation conditions of the precursors. Stabilizers such as diacetone alcohol, acetylacetone, acetic acid or formamide may also be used.

After deposition, a drying step is generally carried out between 20 and 150° C., advantageously at a temperature of the order of 100° C., followed by a heat treatment at a temperature of the order of 450 to 600° C. for a period between a few minutes and a few hours, advantageously at a temperature of the order of 550° C. for a period of the order of 30 min.

Through the methods for producing TCO layers from molecular precursors in solution, the layers generally have a maximum thickness of 150 nm, such a thickness often being obtained by multiple depositions.

Through the methods for producing TCO layers by deposition of dispersions of TCO nanoparticles that are already crystallized, the layers may be much thicker (greater than 500 nm without any problem, with a single deposition). The conductivity is lower than in the case of the layers obtained from molecular precursors but remains correct. No high-temperature heat treatment is necessary since the nanoparticles are already crystallized.

A TCO layer produced from precursors is smoother than a layer produced from (nano)particles.

The electroconductive coating may also comprise or be composed of an essentially polymer layer deposited via a liquid route, optionally capable, where appropriate, of forming a binder for the electroconductive (nano)particles of the fill layer.

For example, it is a layer of one or more conductive polymers from at least one of the following families:
- the family of polythiophenes, such as PEDOT (3,4-polyethylenedioxythiopene), PEDOT/PSS that is to say 3,4-polyethylenedioxythiopene blended with polystyrenesulphonate, and other derivatives described in Application US 2004/253439;
- or else poly(acetylene)s, poly(pyrrole)s, poly(aniline)s, poly(fluorene)s, poly(3-alkyl thiophene)s, polytetrathiafulvalenes, polynaphthalenes, poly(p-phenylene sulphide), and poly(para-phenylene vinylene)s.

As polythiophenes, it is possible to choose, for example, the product sold by HC Strack under the name BAYTRON® or else sold by Agfa under the name Orgacon®, or Orgacon EL-P3040®.

The conductive polymer is part of the electrode and also optionally serves as a hole injection layer.

The fill material may also comprise or be composed of an essentially polymer layer deposited via a liquid route. For example, it is a layer of one or more of the aforementioned conductive polymers. However, layers based on nanoparticles, in particular on conductive metal oxides, are more transparent, (in particular less coloured), especially when they are very thick.

Preferably, the composite electrode, at the very least, the fill material and/or the electroconductive coating has (have) colorimetric coordinates a* and b* below 5 in absolute value in the CIELAB diagram.

An electroconductive coating and/or a fill material having a light transmission greater than or equal to 70% at 550 nm, more preferably still greater than or equal to 80% at 550 nm, or even over the entire visible range, is preferred.

In the present application, the network arrangement may be obtained directly by deposition(s) of electroconductive material(s) in order to reduce the fabrication costs.

Thus, post-structuring operations are avoided, for example dry and/or wet etching operations, which often require lithographic processes (exposure of a resist to radiation and development).

This direct arrangement as a network may be obtained directly by one or more suitable deposition methods, for example using a stamp pad, or else via ink-jet printing (with a suitable nozzle).

The electroconductive network may be obtained moreover directly by electroconductive deposition(s) through a network of openings in a mask on the substrate (mask then removed), or even also by prior electroconductive deposition(s) in an etching network of the substrate formed, for example, by etching through said mask, for example over a depth starting from 10 nm, preferably not beyond 100 nm, in particular of the order of 50 nm. This may favour the anchoring of the strands.

In the case of a glass substrate, it is possible, for example, to use fluorine plasma etching, in particular under vacuum, for example via $CF_4$ or $CHF_3$. Under an oxygen atmosphere, it is possible to control the etching rate of the mask, which is in particular chosen to be organic.

The arrangement of the strands may then be substantially the replica of that of the network of openings in the mask and of the (optional) etching network for the innermost part. Preferably a mask is chosen that is stable without the use of an annealing operation.

It is thus possible to then preferably choose one or more deposition techniques that can be carried out at ambient temperature and/or are simple (in particular simpler than a catalytic deposition that inevitably requires the use of a catalyst) and/or give dense depositions.

It is also possible to choose a non-selective deposition technique, the is deposition filling both a fraction of the openings in the mask and optionally in the subjacent etching network and also covering the surface of the mask or of the substrate. The mask may then be removed.

It is possible in particular to preferably choose a deposition via a liquid route, in particular by printing, by blade coating with an electroconductive ink, and/or a vacuum deposition technique such as sputtering, or more preferably still evaporation.

The deposition(s) may optionally be supplemented with electrolytic surfacing using an electrode made of by Ag, Cu, Au or another high-conductivity metal that can be used.

The electroconductive network may be partly deposited in an etching network of the substrate, in particular glass substrate as already seen. The substrate may be etched via a wet route (for example with an HF solution for glass), a sol-gel mask with a suitable network of openings may be chosen.

Advantageously, the electroconductive network, then qualified as self-organized, may be obtained by deposition(s) of electroconductive material(s) in a network of self-generated openings in a mask on the substrate.

The network of self-generated openings may for example be obtained by curing a continuous deposition of a material suitable for this purpose. These may be interstices, or cracks in particular such as those described in document U.S. Pat. No. 7,172,822.

The reduction in the number of technological steps necessary for producing such a self-cracked mask favourably influences production yields and the costs of the desired end product.

The self-generated openings, and therefore the strands, may be irregular, distributed aperiodically or (pseudo)randomly.

The mask, preferably having self-generated openings, is removed before deposition of the electroconductive smoothing coating.

As already seen, the electroconductive coating may substantially completely fill the space between the strands to form a buried composite electrode that is simple and rapid to fabricate. The fill material is thus made of the material of the coating. Its thickness may in particular be at least one and a half times, or even two times, greater than the height of the strands.

In this configuration, an electroconductive coating deposited, for example, by printing, (in particular by flexographic printing), by spray coating or by dip coating may preferably be chosen, the coating being deposited in one or more passes.

Furthermore, still in this mask-free configuration, the following characteristics may be provided:
the space between the strands is filled, preferably over its entire height, with a fill material, known as a high-index fill material, having a refractive index greater than or equal to 1.65 at least at 550 nm, preferably over the entire visible range, more preferably still a refractive index between 1.65 and 2 at 550 nm, or even over the entire visible range, preferably the distance B between strands is less than or equal to 50 µm, more preferably still less than or equal to 30 µm;
and the strands are made of a metal with colourless reflection (white metal), preferably silver and aluminium or else platinum, chromium, palladium and nickel.

In fact, a fill material is chosen that has an index at least greater than or equal to the index of the active OLED system (that typically has an optical index of the order of 1.7 to 1.9) minus 0.05. Through the choice of such an index, the extraction of the guided modes of the OLED system and, by bringing the strands close enough together, the diffusion of the radiation extracted over the edges of the strands are favoured. The efficiency of the OLED is then increased.

Moreover, a fill material that is not very absorbent, in particular having an absorption in the visible range of less than $10^{-2}$ cm$^{-1}$ is preferred.

As a high-index fill material that is inorganic and electroconductive by addition of electroconductive (nano)particles, a deposition based on a metal oxide as already indicated, in particular based on $ZrO_2$, $TiO_2$, $Al_2O_3$ or $Ta_2O_5$ may, for example, be chosen. These oxides may be deposited under vacuum or preferably by a liquid route. They may be sol-gels.

As an example of a high-index fill material of sol-gel type, mention may be made of the hybrid sol-gel layers obtained from metallic precursors complexed by stabilizers. For example, layers obtained from solutions of zirconium propoxide or of titanium butoxide complexed by acetylacetone in an alcohol medium. When it does not undergo a high-temperature heat treatment to lead to the corresponding oxide, such a material is composed of a metal oxyhydroxide complexed by the organic molecules. The organic functional groups may be removed by heat treatment starting from 350° C. to obtain inorganic sol-gel layers.

As a high-index inorganic fill material, a high-index glass frit (lead glass, bismuth glass, etc.) may also be chosen, for example deposited by screen printing or by spray coating and filled with electroconductive (nano)particles.

As high-index polymers, mention may be made of the following polymers: poly(1-naphthyl methacrylate-co-glycidyl methacrylate), with 10 mol % of glycidyl methacrylate, poly(2,4,6-tribromophenyl methacrylate), poly(2,4,6-tribromophenyl methacrylate-co-glycidyl methacrylate) with 10 mol % of glycidyl methacrylate, poly(2,6-dichlorostyrene), poly(2-chlorostyrene), poly(2-vinylthiophene), poly(bis(4-iodophenoxy)phosphazene), poly(N-vinylphthalimide), poly(pentabromobenzyl acrylate), poly(pentabromobenzyl methacrylate), poly(pentabromobenzyl methacrylate-co-glycidyl methacrylate) with 10 mol % of glycidyl methacrylate, poly(pentabromophenyl acrylate-co-glycidyl methacrylate) with 10 mol % of glycidyl methacrylate, poly(pentabromophenyl acrylate-co-glycidyl methacrylate) with 50 mol % of glycidyl methacrylate, poly(pentabromophenyl methacrylate), poly(penta-bromophenyl methacrylate-co-glycidyl methacrylate) with 10 mol % of glycidyl methacrylate, poly(pentabromophenyl methacrylate-co-glycidyl methacrylate) with 50 mol % of glycidyl methacrylate, poly(pentachlorophenyl methacrylate), poly(vinyl phenyl sulphide), poly(vinyl phenyl sulphide-co-glycidyl methacrylate) with 10 mol % of glycidyl methacrylate. These polymers are sold, for example, by Sigma-Aldrich.

Another possibility for obtaining a high-index fill material consists in choosing transparent materials with high-index particles, which are polymeric or else inorganic, and the high-index materials already mentioned, for example particles made of $ZrO_2$, $TiO_2$, $SnO_2$ or $Al_2O_3$ are chosen.

As a transparent material of sol-gel type, it is possible to choose the silica produced from tetraethoxysilane (TEOS), sodium, lithium or potassium silicate, or a hybrid, obtained from organosilane-type precursors, the general formula of which is:

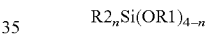

$$R2_n Si(OR1)_{4-n}$$

with n being an integer between 0 and 2, R1 an alkyl function of $C_xH_{2x+1}$ type, R2 an organic group comprising, for example, an alkyl, epoxy, acrylate, methacrylate, amine, phenyl or vinyl function. These hybrid compounds may be used as mixtures or alone, in solution in water or in a water/alcohol mixture having a suitable pH.

As transparent polymer materials, it is possible to choose silicones, epoxy resins, polyurethanes PUs, ethylene/vinyl acetate EVA, polyvinyl butyral PVB, polyvinyl acetate PVA, and acrylics.

Furthermore, the high-index fill material may be weakly electroconductive (before or without addition of electroconductive (nano)particles), of resistivity ρ2 greater than the resistivity of the network as already described. This high-index material may cover the surface of the strands, to form a layer subjacent to the electroconductive coating or even to form the electroconductive coating according to the invention. Its thickness is greater than the height of the conductive strands.

It is then possible to choose, in particular, the materials already described for the electroconductive and high-index coating:
one layer, in particular a sol-gel layer, of single or mixed metal oxides already described;
the polymer PEDOT, PEDOT/PSS, etc.;
as already indicated, the high-index sol-gel matrices or polymers already described and filled with (nano)particles of conductive oxides (ZnO, ITO, IZO, $SnO_2$, ATO, etc.), the solid content by weight being between 0.5% and 80% in order to adjust the resistivity.

In one advantageous mask-free conception, the fill material is electroconductive and diffusing, in particular based on diffusing (optionally electroconductive) particles and on electroconductive (nano)particles as already mentioned.

A diffusing electroconductive fill material having a haze greater than 5% may be preferred.

The diffusing (optionally electroconductive) particles may be dispersed in a binder, for example an electroconductive binder, in proportions of 1 to 80% by weight of the mixture.

These diffusing particles may have an average size that is greater than 50 nm and submicron-sized, preferably between 100 and 500 nm, or even between 100 and 300 nm.

The index of the diffusing particles may advantageously be greater than 1.7 and that of the binder may preferably be less than 1.6, for example silica or a hybrid organosilicon material.

The diffusing particles may be organic, for example made of an aforementioned high-index polymer material. Preferably, these diffusing particles may be mineral, preferably nitrides, carbides or oxides, the oxides being chosen from alumina, zirconia, titania, ceria or being a mixture of at least two of these oxides.

The binder of the diffusing fill material may preferably be chosen from mainly mineral binders, such as potassium silicates, sodium silicates, lithium silicates, aluminium phosphates, silica, and glass frits.

As a hybrid organic/mineral binder, mention may be made of the organosilane-based binders as described previously for the transparent materials.

The diffusing fill material may be deposited by any layer deposition technique known to a person skilled in the art, in particular by screen printing, by coating of a paint, by dip coating, by spin coating, by sputtering, or else by flow coating.

This diffusing fill layer makes it possible to increase the efficiency of the OLED, in particular for relatively large distances between strands, i.e. from 30 μm and even more so to 100 μm and above.

The diffusing fill material may only partially fill the space, in particular is may be in the lower part of the space between the network, the upper part being made of another fill material.

The diffusing fill material may be with an insulating binder if it contains electroconductive (nano)particles. Its thickness may then be preferably be between 20% and 100% of the height of the conductive strands and advantageously between 50% and 100% of the thickness of the strands.

The diffusing fill material may be weakly electroconductive, of resistivity $\rho 2$ greater than the resistivity of the network as already described. This diffusing fill material may even cover the surface of the strands, to form a layer subjacent to the electroconductive coating or even to form the electroconductive coating according to the invention. Its thickness may then optionally be greater than the height of the conductive strands.

In summary, it is possible to choose, as the electroconductive diffusing fill material:
- a conductive polymer material, for example those already described for the electroconductive coating (PEDOT, PEDOT/PSS in particular), filled with diffusing particles;
- and/or an insulating binder (mineral, sol-gel route, resin, etc.) filled with diffusing particles of transparent conductive oxide(s), for example ITO;
- and/or a stack of diffusing particles of transparent conductive oxide(s);
- and/or an optionally insulating binder filled with electroconductive (nano)particles and with diffusing particles.

It is possible to choose, as the electroconductive fill material, a fused glass frit (filled with electroconductive (nano) particles) or a sol-gel layer (optionally filled with electroconductive (nano)particles).

Numerous chemical elements may be the basis of the sol-gel fill layer. It may comprise, as an essential constituent material, at least one compound of at least one of the elements: Si, Ti, Zr, Sb, Hf, Ta, Mg, Al, Mn, Sn, Zn, Ce. It may be in particular a single oxide or a mixed oxide of at least one of the aforementioned elements. The fill material may preferably be mainly based on silica, in particular for its adhesion to and its compatibility with a mineral glass.

The sol precursor of the constituent material of the silica layer may be a silane, in particular a tetraethoxysilane (TEOS) and/or a methyltriethoxy-silane (MTEOS), or a lithium, sodium or potassium silicate.

The silica may be a hybrid obtained by or a compound of general formula $R2_n Si(OR1)_{4-n}$, as already mentioned above.

The preferred fill material may be deposited preferably by screen-printing, dip coating or spray coating. The conductive subjacent coating may be deposited preferably by printing, in particular by flexographic printing, by dip coating or spray coating.

The electroconductive network may be composite, in particular multilayered.

Furthermore, the electroconductive network may comprise or be composed of a layer based on a metal oxide that is inexpensive and easy to fabricate, for example zinc oxide ZnO, or tin oxide $SnO_2$, or else mixed indium and tin oxide ITO. These metal oxides are, for example, deposited by vacuum deposition, by magnetron sputtering, or by ion-beam sputtering.

The electroconductive network may be based on a pure metal material chosen from silver, aluminium, or even platinum, gold, copper, palladium, chromium or based on said material alloyed or doped with at least one other material: Ag, Au, Pd, Al, Pt, Cu, Zn, Cd, In, Si, Zr, Mo, Ni, Cr, Mg, Mn, Co, Sn.

The electroconductive network may comprise or be composed of a layer made of a mainly metal material (continuous medium) and/or of a layer based on metal particles dispersed in a matrix that may or may not be electroconductive, for example an ink filled with conductive, in particular silver, particles such as the product TEC-PA-030® sold by InkTec which may be deposited by blade-coating.

As already seen, the deposition(s), in particular metallic deposition(s), may optionally be completed by an electrolytic recharge using an electrode made of Ag, Cu, Au or another high-conductivity metal that can be used.

Strands may be multilayers, in particular made of a metal first layer made from the aforementioned materials, in particular silver, aluminium, optionally surmounted by copper, and of an overlayer for protection against corrosion (water and/or air), for example of conductive or metallic transparent oxides, in particular made of nickel, or chromium or molybdenum or mixtures thereof, having a thickness starting from 10 nm, typically 20 to 30 nm, and for example up to 200 nm or even 100 nm. For example, the overlayer is deposited by evaporation or sputtering.

Preferably, the composite electrode according to the invention (strands, fill material, electroconductive coating) may be mainly mineral, more preferably still, the substrate is also a glass substrate.

The substrate may be flat or curved, and also rigid, flexible or semi-flexible.

Its main faces may be rectangular, square or even of any other (round, oval, polygonal, etc.) shape. This substrate may be of a large size, for example, having a surface area greater than 0.02 m² or even 0.5 m² or 1 m² and with one lower electrode substantially occupying the surface area (apart from the structuring zones)

The substrate may be substantially transparent, mineral or made of a plastic such as polycarbonate PC or polymethyl methacrylate PMMA or else PET, polyvinyl butyral PVB, polyurethane PU, polytetrafluoroethylene PTFE, etc.

The substrate is preferably a glass substrate, in particular made of soda-lime-silica glass.

The substrate may advantageously be a glass having an absorption coefficient less than 2.5 m$^{-1}$, preferably less than 0.7 m$^{-1}$ at the wavelength of the OLED radiation(s). Soda-lime-silica glasses are, for example, chosen with less than 0.05% Fe III or Fe$_2$O$_3$, in particular the glass DIAMANT from Saint-Gobain Glass, the glass OPTIWHITE from Pilkington the glass B270 from Schott. It is possible to choose all the extra-clear glass compositions described in document WO 04/025334.

The thickness of the substrate, in particular the chosen glass substrate, may be at least 0.35 mm, preferably at least 0.7 mm.

The edges of the panel of the substrate may also be reflective and preferably have a mirror, for optimum recycling of the guided radiation, and the edges form with the main face associated with the OLED system an external angle greater than or equal to 45°, but less than 90°, preferably greater than or equal to 80°, in order to redirect the radiation over a wider extraction area. The panel may thus be bevelled.

Furthermore, the process of fabricating the electrode described in document U.S. Pat. No. 7,172,822 inevitably requires the deposition of a sublayer that can be modified at the cracks in order to allow catalyst grafting for metal postgrowth, this sublayer therefore having a functional role in the growth process of the network.

This sublayer may also have one of or the following drawbacks:
  low adhesion to a soda-lime glass substrate;
  instability in a basic medium, frequently used during washing of the substrates;
  instability during high-temperature heat treatments (toughening, annealing, etc.).

Therefore, the composite electrode according to the invention may preferably be directly on the substrate, in particular glass substrate.

Moreover, to facilitate the power supply of the electrodes and/or to form a plurality of illumination zones, the composite electrode according to the invention may be discontinuous, typically forming at least two electrode zones insulated from one another, and preferably one or more parallel rows of composite electrode zones. In order to do this, the composite electrode is etched, for example with a laser, and the hollow created is filled with a passivation material, for example polyamide.

The substrate bearing the composite electrode as defined previously may also comprise an organic light-emitting system deposited directly on the outer surface.

The invention also relates to an organic light-emitting device incorporating the substrate bearing the composite electrode as defined previously, the composite electrode forming what is known as the lower electrode, closest to the substrate.

The organic light-emitting device may comprise:
  a row of composite (lower) electrode zones;
  at least one discontinuous layer made of organic electroluminescent material(s) in the form of electroluminescent layer zones and arranged on the composite (lower) electrode zones; and
  a discontinuous upper electrode having an electroconductive layer in the form of electrode zones arranged on the electroluminescent layer zones.

Various types of connection are possible:
  a single series connection of all of the electroluminescent zones;
  a combination of series and parallel connections;
  series connections specific to each row.

It is recalled that in a series connection, the current flows from an upper electrode zone to the adjacent lower electrode zone.

For a series connection per row, the electroluminescent layer zones may be offset from the lower electrode zones in the direction of the row and along a given direction and the upper electrode zones may be offset from the electroluminescent zones in the direction of the row and in the same direction.

The distance between the electroluminescent zones of separate rows may be greater than the distance between the zones of a given row, preferably from 100 μm upwards, especially between 100 μm and 250 μm.

Each row is thus independent. If one of the zones in each row is defective, the entire row nevertheless operates. The adjacent rows are intact.

The organic light-emitting device according to the invention may or may not be provided with current leads.

Two continuous or discontinuous current lead bands forming part of a current collector or distributor may be respectively in electrical contact with a peripheral edge of the composite lower electrode, and with a peripheral edge of the upper electrode.

These current lead bands may preferably have a thickness between 0.5 and 10 μm and a width of 0.5 mm, and may be of various forms:
  a metallic monolayer made of one of the following metals: Mo, Al, Cr, Nd or an alloy of metals, such as MoCr, AlNd;
  a metallic multilayer formed from the following metals: Mo, Al, Cr, Nd, such as MoCr/Al/MoCr;
  made of a conductive enamel, for example containing silver and screen-printed;
  made of a conductive material or a material filled with conductive particles and deposited by ink-jet printing; or
  made of a conductive polymer whether doped or not by metals, for example silver.

For the upper electrode, it is possible to use a thin metallic layer called a TCC (Transparent Conductive Coating) for example made of Ag, Al, Pd, Cu, Pd, Pt, In, Mo, Au and typically having a thickness between 5 and 50 nm depending on the desired light transmission/reflection.

The upper electrode may be an electroconductive layer advantageously chosen from metal oxides, especially the following materials: doped zinc oxide, especially aluminium-doped zinc oxide ZnO:Al or gallium-doped zinc oxide ZnO:Ga, or else doped indium oxide, especially tin-doped indium oxide (ITO) or zinc-doped indium oxide (IZO).

More generally, it is possible to use any type of transparent electroconductive layer, for example a layer called a TCO (transparent conductive oxide) layer, for example with a thickness between 20 and 1000 nm.

The OLED device may produce monochromatic, especially blue and/or green and/or red, light or may be adapted so as to produce white light.

To produce white light, several methods are possible: mixing of compounds (red, green, blue emission) in a single layer; stacking on the face of the electrodes of three organic structures (red, green and blue emission) or two organic structures (yellow and blue); series of three adjacent organic structures (red, green, blue emission) on the face of the electrodes, one organic structure in one colour and on the other face of the suitable phosphor layers.

The OLED device may comprise a plurality of adjacent organic light-emitting systems, each emitting white light, or by a series of three, emitting red, green and blue light, the systems being for example connected in series.

Each row may for example emit in a given colour.

The OLED device may form part of a multiple glazing unit, especially a vacuum glazing unit or one with an air layer or layer of another gas. The device may also be monolithic and comprise a monolithic glazing unit in order to be more compact and/or lighter.

The OLED system may be bonded to, or preferably laminated with another flat substrate, called a cover, preferably transparent, such as a glass, using a laminating interlayer, especially an extra-clear interlayer.

The laminated glazing units usually consist of two rigid substrates between which a thermoplastic polymer sheet or superposition of such sheets is placed. The invention also includes what are called "asymmetric" laminated glazing units using in particular a rigid carrier substrate of the glass type and, as a covering substrate, one or more protective polymer sheets.

The invention also includes laminated glazing units having at least one interlayer sheet based on a single-sided or double-sided adhesive polymer of the elastomer type (i.e. one not requiring a lamination operation in the conventional meaning of the term, lamination requiring heating generally under pressure so as to soften the thermoplastic interlayer sheet and make it adhere).

In this configuration, the means for fastening the cover to the carrier substrate may then be a lamination interlayer, especially a sheet of thermoplastic, for example polyurethane (PU), polyvinyl butyral (PVB) or ethylene/vinyl acetate (EVA), or a thermally curable single-component or multi-component resin (epoxy, PU) or ultraviolet-curable single-component or multi-component resin (epoxy, acrylic resin). Preferably, the sheet has (substantially) the same dimensions as the cover and the substrate.

The lamination interlayer may prevent the cover from flexing, especially for large devices, for example with an area greater than 0.5 m$^2$.

In particular, EVA offers many advantages:
it contains little or no water by volume;
it does not necessarily require high pressure for processing it.

A thermoplastic lamination interlayer may be preferred to a cover made of cast resin as it is both easier to implement and less expensive and is possibly more impervious.

The interlayer optionally includes a network of electroconductive wires set into its internal surface, facing the upper electrode, and/or an electroconductive layer or electroconductive bands on the internal surface of the cover.

The OLED system may preferably be placed inside the double glazing unit, especially with an inert gas (for example argon) layer.

Furthermore, it may be advantageous to add a coating having a given functionality on the opposite face from the substrate bearing the electrode according to the invention or on an additional substrate. This may be an anti-fogging layer (using a hydrophilic layer), an anti-fouling layer (a photocatalytic coating comprising $TiO_2$, at least partly crystallized in anatase form), or else an anti-reflection multilayer for example of the $Si_3N_4/SiO_2/Si_3N_4/SiO_2$ type, or else a UV filter such as, for example, a layer of titanium oxide ($TiO_2$). It may also be one or more phosphor layers, a mirror layer or at least one scattering light extraction layer.

The invention also relates to the various applications to which these OLED devices may be put, said devices forming one or more luminous surfaces, which are transparent and/or reflecting (mirror function), placed both for outdoor and indoor applications.

The device may form, (alternatively or in combination), an illuminating, decorative, architectural etc. system, or an indicating display panel—for example of the drawing, logo or alphanumeric indication type, especially an emergency exit panel.

The OLED device may be arranged to produce uniform light, especially for homogeneous illumination, or to produce various luminous zones, of the same intensity or of different intensity.

Conversely, differentiated illumination may be sought. The organic light-emitting system (OLED) produces a direct light zone, and another luminous zone is obtained by extraction of the OLED radiation that is guided by total reflection in the thickness of the substrate, which is chosen to be made of glass.

To form this other luminous zone, the extraction zone may be adjacent to the OLED system or on the other side from the substrate. The extraction zone, or zones may serve for example to increase the illumination provided by the direct light zone, especially for architectural illumination, or else to indicate the luminous panel. The extraction zone or zones are preferably in the form of one or more, especially uniform, bands of light and these preferably being placed on the periphery of one of the faces. These bands may for example form a highly luminous frame.

Extraction is achieved by at least one of the following means placed in the extraction zone: a diffusing layer, preferably based on mineral particles and preferably with a mineral binder; the substrate made to be diffusing, especially a textured or rough substrate.

The two main faces may each have a direct light zone.

When the electrodes and the organic structure of the OLED system are chosen to be transparent, an illuminating window may in particular be produced. Improvement in illumination of a room is then not achieved to the detriment of light transmission. By also limiting the light reflection, especially on the external side of the illuminating window, it is also possible to control the level of reflection, for example so as to meet the anti-dazzling standards in force for the facades of buildings.

More broadly, the device, especially a partly or entirely transparent device, may be:
intended for buildings, such as exterior luminous glazing, an internal luminous partition or a luminous glazed door (or part of a door), especially a sliding one;
intended for a transport vehicle, such as a luminous roof, a luminous side window (or part of a window), an internal luminous partition of a terrestrial, water-borne or airborne vehicle (car, lorry, train, aeroplane, boat, etc.);
intended for urban or professional furniture, such as a bus shelter panel, a wall of a display counter, a jewellery display or a shop window, a greenhouse wall, or an illuminating tile;
intended for interior furnishings, a shelf or cabinet element, a facade of a cabinet, an illuminating tile, a ceiling, an illuminating refrigerator shelf, an aquarium wall;

intended for the backlighting of electronic equipment, especially a display screen, optionally a double screen, such as a television or computer screen, a touch screen.

For example, it is possible to envisage backlighting for a double-sided screen with different sizes, the small screen preferably being associated with a Fresnel lens to concentrate the light.

To form an illuminating mirror, one of the electrodes may be reflecting, or a mirror may be placed on the opposite face to the OLED system, if preferential lighting on only one side in the direct light zone is desired.

It may also be a mirror. The luminous panel may serve for illuminating a bathroom wall or a kitchen worktop, or may be a ceiling.

The OLEDs are generally divided into two broad families depending on the organic material used.

If the electroluminescent layers are formed from small molecules, the devices are referred to as SM-OLED (Small-Molecule Organic Light-Emitting Diodes). The organic electroluminescent material of the thin layer consists of evaporated molecules, such as for example those of the complex $AlQ_3$ (tris(8-hydroxyquinoline)aluminium), DPVBi (4,4'-(diphenylvinylene)biphenyl), DMQA (dimethyl quinacridone) or DCM (4-(dicyanomethylene)-2-methyl-6-(4-dimethylaminostyryl)-4H-pyran). The emissive layer may also for example be a layer of 4,4',4''-tri(N-carbazolyl)triphenylamine (TCTA) doped with fac-tris(2-phenylpyridine)iridium $[Ir(ppy)_3]$.

In general, the structure of an SM-OLED consists of a stack of an HIL (hole injection layer), an HTL (hole transporting layer), an emissive layer and an ETL (electron transporting layer).

An example of a hole injection layer is copper phthalocyanine (CuPC) and the hole transporting layer may for example be N,N'-bis(naphthalen-1-yl)-N,N-bis(phenyl)benzidine (alpha-NPB).

The electron transporting layer may be composed of tris-(8-hydroxyquinoline)aluminium ($AlQ_3$) or bathophenanthroline (BPhen).

The upper electrode may be an Mg/Al or LiF/Al layer.

Examples of organic light-emitting stacks are for example described in document U.S. Pat. No. 6,645,645.

If the organic electroluminescent layers are polymers, the devices are referred to as PLEDs (polymer light-emitting diodes).

The organic electroluminescent material of the thin layer consists of CES polymers (PLEDs) such as for example PPV standing for poly(para-phenylenevinylene), PPP (poly(para-phenylene)), DO-PPP (poly(2-decyloxy-1,4-phenylene)), MEH-PPV (poly[2-(2'-ethylhexyloxy)-5-methoxy-1,4-phenylenevinylene]), CN-PPV (poly[2,5-bis(hexyloxy)-1,4-phenylene-(1-cyanovinylene)]) or PDAFs (polydialkylfluorenes), and the polymer layer is also associated with a layer that promotes hole injection (an HIL) consisting for example of PEDT/PSS (poly(3,4-ethylene-dioxythiophene)/poly(4-styrene sulphonate)).

One example of a PLED consists of the following stack:
a layer of poly(2,4-ethylene dioxythiophene) doped with poly(styrene sulphonate) (PEDOT:PSS) with a thickness of 50 nm; and
a layer of phenyl poly(p-phenylenevinylene) Ph-PPV with a thickness of 50 nm.

The upper electrode may be a layer of Ca.

The invention also relates to the process of fabricating the composite electrode on the carrier substrate as defined previously comprising, in a first configuration, the following steps:

a first step of direct formation of the network arrangement of the conductor, comprising at least one of the following depositions:
a deposition of the electroconductive material of the network via a stamp pad;
a deposition via conductive ink-jet printing onto the substrate;
a second step comprising a deposition of the electroconductive coating (different or not from the electroconductive fill material) via a liquid route.

Or, in a second configuration, the following steps:
a first step of direct formation of the network arrangement of the conductor, including a deposition of the electroconductive material through one layer on the preferably glass substrate, known as a mask, with openings self-organized as a network, until a fraction of the depth of the openings has been filled;
optionally, before the first step, an etching of the substrate through the openings of the mask, thus partially anchoring the network in the substrate;
the removal of the mask;
a second step comprising a deposition of the electroconductive coating (different or not from the electroconductive fill material) via a liquid route.

As already indicated, the deposition of the electroconductive material of the network in the mask and optionally partly in the subjacent etching network may preferably be carried out by a simple, non-selective deposition, preferably by vacuum deposition, in particular by evaporation, or else by a liquid route, in particular by blade coating with a conductive ink, by dip coating, or by (flat or rotary) printing.

This deposition is optionally supplemented with electrolytic surfacing using a metal such as gold, silver or copper and/or optionally supplemented with a deposition (PVD, CVD, etc.) of an overlayer for corrosion protection.

In the second configuration, the process according to the invention comprises a step of formation of the mask comprising:
the deposition on the (bare or coated) substrate of a layer known as a masking layer, in particular starting from a solution of colloidal particles that are stabilized and dispersed in a solvent;
the curing (that is to say a drying if the layer is liquid) of the masking layer until the network openings that form said mask are obtained.

It is possible to obtain a two-dimensional network of substantially straight-edged openings forming the mask with a random, aperiodic mesh of openings in at least one direction.

Such a network of openings has substantially more interconnects than the cracked silica sol-gel mask. Via this process according to the invention, a mesh of openings, which may be distributed over the entire surface, is thus formed making it possible to obtain isotropic properties.

The mask thus has a random, aperiodic structure in at least one direction, or even in two (all) directions.

Owing to this particular process, it is possible to obtain, at a lower cost, a mask composed of random (shape and/or size), aperiodic units of suitable characteristic dimensions:
(average) width of the network A is micron-sized, or even nanoscale, in particular between a few hundreds of nanometers to a few tens of microns, especially between 200 nm and 50 µm;
(average) size of unit B is millimetric or even submillimetric, especially between 5 to 500 µm, or even 100 to 250 µm;

B/A ratio is adjustable, in particular, as a function of the nature of the particles, especially between 7 and 20 or even 40;

difference between the maximum width of the openings and the minimum width of the openings is less than 4, or even less than or equal to 2, in a given region of the mask, or even over the majority or the whole of the surface;

difference between the maximum mesh (unit) dimension and the minimum mesh dimension is less than 4, or even less than or equal to 2, in a given region of the mask, or even over the majority or even over the whole of the surface;

the amount of open mesh (non-opening or "blind" interstice) is less than 5%, or even less than or equal to 2%, in a given region of the mask, or even over the majority or the whole of the surface, therefore with a limited or even almost zero network rupture that is optionally reduced and can be suppressed by etching of the network;

for a given mesh, the majority or even all of the meshes in a given region or over the whole of the surface, the difference between the largest dimension that is characteristic of the mesh and the smallest dimension that is characteristic of the mesh is less than 2, in order to strengthen the isotropy; and for the majority or even all of the segments of the network, the edges are constantly spaced, parallel, in particular on a scale of 10 µm (for example, observed with an optical microscope with a magnification of 200).

The width A may be, for example, between 1 and 20 µm, or even between 1 and 10 µm, and B may be between 50 and 200 µm.

This makes it possible to subsequently produce a grid defined by an average strand width substantially identical to the width of the openings and an (average) space between the strands substantially identical to the space between the openings (of a mesh). In particular, the sizes of the strands may preferably be between a few tens of microns to a few hundreds of nanometers. The B/A ratio may be chosen between 7 and 20, or even 30 to 40.

The meshes delimited by the openings are of diverse shapes, typically with three, four or five sides, for example predominantly with four sides, and/or of diverse size, distributed randomly and aperiodically.

For the majority or all of the meshes, the angle between two adjacent sides of one mesh may be between 60° and 110°, especially between 80° and 100°.

In one configuration, a main network is obtained with openings (optionally approximately parallel) and a secondary network of openings (optionally approximately perpendicular to the parallel network), the location and the distance of which are random. The secondary openings have a width, for example, smaller than the main openings.

Drying causes a contraction of the mask layer and friction of the nanoparticles at the surface resulting in a tensile stress in the layer which, via relaxation, forms the openings.

Unlike the silica sol-gel, the solution is naturally stable, with nanoparticles that are already formed, and preferably does not contain (or contains a negligible amount of) a reactive element of polymer precursor type.

Drying results, in one step, in the elimination of the solvent and the formation of the openings.

After drying, clusters of nanoparticles are thus obtained, clusters that are of variable size and are separated by the openings that are themselves of variable size.

In order to obtain the openings throughout the entire depth, it is necessary to both:

choose particles of limited size (nanoparticles), in order to promote their dispersion, preferably with a characteristic (average) size between 10 and 300 nm, or even 50 and 150 nm; and stabilize the particles in the solvent (especially by treatment via surface charges, for example via a surfactant, by control of the pH), to prevent them from agglomerating together, from precipitating and/or from falling due to gravity.

In addition, the concentration of the particles is adjusted, preferably between 5%, or even 10% and 60% by weight, more preferably still between 20% and 40%. The addition of a binder is avoided.

The solvent is preferably water-based, or even entirely aqueous.

In a first embodiment, the colloid solution comprises polymeric nanoparticles (and preferably with a water-based, or even entirely aqueous, solvent). For example, acrylic copolymers, styrenes, polystyrenes, poly(meth)acrylates, polyesters or mixtures thereof are chosen.

In a second embodiment, the solution comprises mineral nanoparticles, preferably of silica, alumina, or iron oxide.

Since the particles have a given glass transition temperature $T_g$, the deposition and drying may preferably be carried out at a temperature below said temperature $T_g$ for better control of the morphology of the grid mask.

The deposition and drying steps of the process may especially be carried out (substantially) at ambient temperature, typically between 20° and 25° C. Annealing is not necessary.

The difference between the given glass transition temperature $T_g$ of the particles and the drying temperature is preferably greater than 10° C., or even 20° C.

The deposition and drying steps of the process may be carried out substantially at atmospheric pressure rather than drying under vacuum, for example.

It is possible to modify the drying parameters (control parameters), especially the degree of moisture and the drying rate, in order to adjust B, A, and/or the B/A ratio.

The higher the moisture is (all things otherwise being equal), the lower A is.

The higher the temperature is (all things otherwise being equal), the higher B is.

By modifying the control parameters chosen from the friction coefficient between the compacted colloids and the surface of the substrate, the size of the nanoparticles, the evaporation rate, the initial particle concentration, the nature of the solvent and the thickness that is dependent on the deposition technique, it is possible to adjust the B/A ratio.

The edges of the mask are substantially straight, that is to say along a mid-plane between 80 and 100° relative to the surface, or even between 85° and 95°.

Due to the straight edges, the deposited layer discontinues (no or little deposition along the edges) and it is thus possible to remove the coated mask without damaging the grid network. For reasons of simplicity, directional techniques for deposition of the grid material may be favoured. The deposition may be carried out both through the interstices and over the mask.

It is possible to clean the network openings prior to carrying out the first deposition step, preferably using an atmospheric pressure plasma source.

The surface for the deposition of the colloid-based mask layer is a film-forming surface, in particular a hydrophilic surface if the solvent is aqueous.

This is the surface of the substrate: glass, plastic (for example, polycarbonate) or of an optionally functional added sublayer: hydrophilic layer (silica layer, for example on plastic) and/or an alkali-metal barrier layer and/or a layer for promoting the adhesion of the grid material, and/or a (transparent) electroconductive layer.

This sublayer is not necessarily a growth layer for an electrolytic deposition of the grid material.

Between the mask layer there may be several sublayers.

The substrate according to the invention may thus comprise a sublayer (especially a base layer, closest to the substrate) that is continuous and capable of being a barrier to alkali metals.

It protects the grid material from any pollution (pollution which may lead to mechanical defects such as delaminations), in the case of an electroconductive deposition (to form an electrode in particular), and additionally preserves its electrical conductivity.

The base layer is robust, quick and easy to deposit according to various techniques. It can be deposited, for example, by a pyrrolysis technique, especially in the gas phase (technique often denoted by the abbreviation CVD for "chemical vapour deposition"). This technique is advantageous for the invention since suitable adjustments of the deposition parameters make it possible to obtain a very dense layer for a reinforced barrier.

The base layer may optionally be doped with aluminium and/or boron to render its deposition under vacuum more stable. The base layer (a single layer or multilayer, optionally doped) may have a thickness between 10 and 150 nm, more preferably still between 15 and 50 nm.

The base layer may preferably be:
  based on silicon oxide, silicon oxycarbide, a layer of general formula SiOC;
  based on silicon nitride, silicon oxynitride, silicon oxycarbonitride, a layer of general formula SiNOC, especially SiN, in particular $Si_3N_4$.

Most particularly, a base layer (predominantly) made of doped or undoped silicon nitride $Si_3N_4$ may be preferred. Silicon nitride is deposited very rapidly and forms an excellent barrier to alkali metals.

As a layer that promotes the adhesion of the metal grid material (silver, gold), especially onto glass, it is possible to choose a layer based on NiCr, Ti, Nb, Al, a single or mixed, doped or undoped metal oxide (ITO, etc.), for example, having a thickness less than or equal to 5 nm.

When the substrate is hydrophobic, it is possible to add a hydrophilic layer such as a silica layer.

Before the second deposition step, a removal step is provided, preferably via a liquid route, for example by selective chemical dissolving of the mask (in water, alcohol, acetone or acid or basic solutions), optionally when hot and/or assisted by ultrasound, until said electroconductive network is revealed.

It is also possible to deposit a weakly electroconductive fill material different from the electroconductive coating of resistivity $\rho 2$ having a thickness greater than the thickness of the network.

This electroconductive fill material may optionally also be diffusing, high-index, and made of the materials already described, in particular it may be a sol-gel layer.

The deposition may be carried out, for example, by printing, by screen-printing, by blade coating with an ink, by dip coating or by spray coating depending on the materials and formulations chosen.

For the filling, it is possible to deposit a dispersion of electroconductive (nano)particles, in particular (nano)particles of (transparent) conductive oxides, for example as already mentioned, which is mainly binder-free, and it is then possible to deposit an electroconductive binder of the (nano) particles, in particular a sol-gel of (transparent) conductive oxides preferably of the same chemical nature as the (nano)particles, that penetrates into the layer of (nano)particles and forms the coating that covers the (nano)particles (for the smoothing operation).

Preferably the composite electrode, at the very least the electroconductive coating, is resistant to the following OLED manufacturing steps:
  resistant to 200° C. for 1 h
  resistant to a pH of 13 (cleaning solution)
  resistant to a pH between 1.5 and 2 (in particular when depositing PEDOT for the electroconductive coating, before the OLED stack)
  delamination resistance (scotch tape test).

Finally, during said second deposition step of the process, it is possible to provide the filling of the space between strands, by the electroconductive coating, in one or more passes.

The invention will now be described in greater detail by means of non-limiting examples and figures.

For the sake of clarity, it should be mentioned that the various elements of the objects shown are not drawn to scale.

ORGANIC LIGHT-EMITTING DEVICES

EXAMPLE 1

Figure 1:
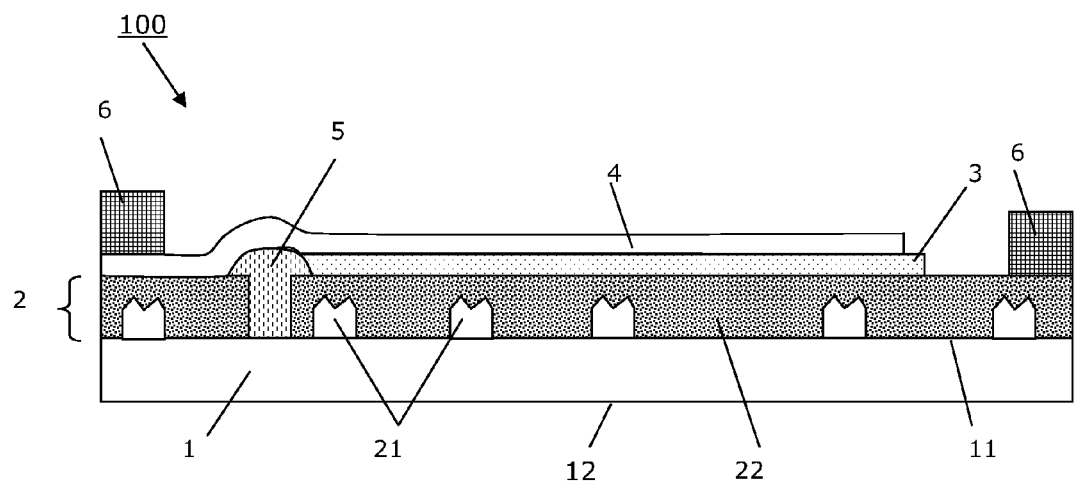
FIG. 1 is a schematic cross-sectional view of a first organic light-emitting device, which comprises a composite lower electrode according to a first embodiment of the invention.

FIG. 1, which is intentionally highly schematic, shows in cross section an organic light-emitting device 100 (with emission through the substrate or "bottom emission").

This device 100 comprises a flat substrate 1 of soda-lime-silica glass that is for example clear, for example rectangular, with a thickness of 0.7 mm, with first and second main faces 11, 12. The first main face 11 comprises:
  a composite lower electrode 2, explained in detail later on;
  an organic light-emitting system 3, for example an SM-OLED of the following structure:
    an alpha-NPDS layer;
    a TCTA+Ir(ppy)$_3$ layer;
    a BPhen layer;
    an LiF layer;
    a reflective upper electrode 4, in particular that is metallic, in particular that is based on silver or on aluminium.

More specifically, the composite lower electrode 2 comprises firstly a 1 μm thick, aperiodic network conductor 21, formed from irregular silver-based strands, of average width A of around 3 μm, and spaced apart from one another by an average distance B of around 30 μm, with a B/A ratio of 10.

In this way, through a judicious choice of B/A and of the thickness, the particularly low sheet resistance of this network 21 is around 0.6 Ω/□. The light transmission $T_L$ of this network 21 is around 70% and the strands are invisibles to the naked eye.

Optionally, it is possible to deposit an overlayer for protection against corrosion, for example made of nickel and/or chromium or made of TCO, having a thickness of about 10 nm, onto the metallic strands, thus forming composite strands.

The composite lower electrode 2 then comprises an electroconductive coating 22, the latter filling the space between strands and covering the strands so as to form a smoothed outer surface of the electrode.

This electroconductive coating 22 is made of an IZO material with a thickness on top of the strands of around 500 nm, and a resistivity $\rho 1$ of around $10^{-2}$ Ω·cm to better distribute the current. The light transmission $T_L$ of the composite electrode 2 is 60%.

This electroconductive coating 22 is obtained, a sol-gel layer obtained from zinc acetate and indium nitrate in solution in 2-methoxyethanol. Ethanolamine is used as a stabilizer. The molar ratio between the zinc and the indium is 0.5. The formulation is preferably deposited by dip-coating or by spray-coating. The formulation deposited is dried for 1 h at 100° C., then annealed at 500° C. for 1 h. One variant consists in doping this material with gallium, the material is then named IGZO. This is carried out by adding the desired amount of gallium nitrate to the sol.

This sol-gel electroconductive coating 22 may also be obtained from $InCl_3$ and $ZnCl_2$ precursors.

Figure 2:
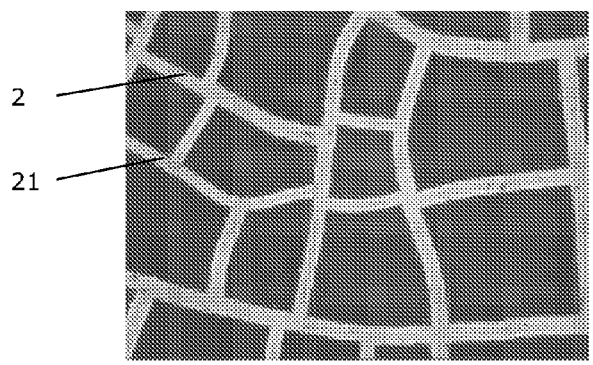
FIG. 2 illustrates a schematic top view of the network of the electrode used in the device from FIG. 1.

The electroconductive network 21 is fabricated by evaporation of silver on a mask provided with a network of self-organized openings. The mask is then removed. The irregular arrangement of the electroconductive network 21 with its strands 210 is shown in FIG. 2.

For the power supply of the electrodes 2, 4, an opening of the composite electrode 2 is made in the vicinity of a longitudinal edge and preferably over its entire length, before the deposition of the organic layers 3. This opening is made, for example, with a laser and is around 150 μm wide. This etched zone is then passivated by means of an insulating resin 5 of acrylic type.

In the electrical junction zones, provided here in the vicinity of the longitudinal edges, it is preferred to add conventional busbars 6, for example by screen-printing of silver on the electrodes 2, 4.

The device 100 produces homogeneous illumination over an area which may be large. If it is desired to create a plurality of luminous zones, at the time of etching for the connection system, other suitable laser etchings are carried out, for example 150 μm wide, and are then passivated.

EXAMPLE 2

Figure 3A:
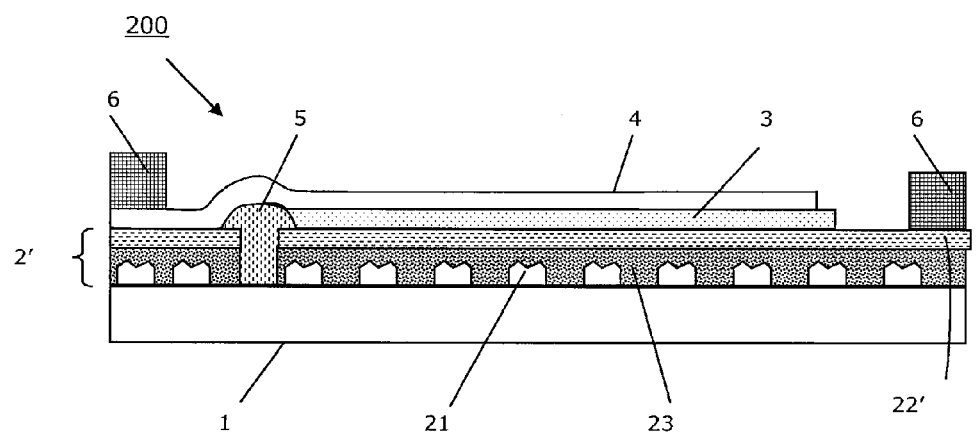
FIG. 3a is a schematic cross-sectional view of a second organic light-emitting device, which comprises a composite lower electrode according to a second embodiment of the invention.

FIG. 3a shows a cross-sectional view of an organic light-emitting device 200 which comprises a composite electrode 2'. Only the modifications with respect to the device 100 are explained in detail below.

Between the strands of the network 21 and on top of the strands, use is made of a fill layer 23, formed from nanoparticles of conductive oxides having a size of less than 50 nm. This layer 23 may be deposited with a solvent which is then evaporated.

The electroconductive fill layer has, for example, a resistivity $\rho 2$ of between $10^{-3}$ and $10^3$ Ω·cm, preferably with $\rho 2$ less than $\rho 1$. To do this, use is made of a layer based on transparent conductive oxides such as ZnO, $SnO_2$, ITO, IZO, deposited, for example, by dip coating, by spray coating (sol-gel route in particular) or else by screen-printing. To facilitate the fabrication, its thickness is greater than that of the network 22, the fill layer then covering the network.

For the fill layer, use may be made of the following products sold by Sumitomo Metal Mining Co. Ltd.:
X100®, X100®D ITO particles dispersed in a(n) (optional) resin binder and with ketone solvent;
X500® ITO particles dispersed in an alcohol solvent;
CKR® gold-coated silver particles in an alcohol solvent;
CKRF® agglomerated gold and silver particles.

The electroconductive coating 22', made of PEDOT/PSS deposited by a liquid route, has a resistivity $\rho 1$ of around $10^{-1}$ Ω·cm, a thickness of around 100 nm, covers the fill material to further smooth the electrode 2'.

EXAMPLE 2A

In a first variant of Example 2, in order to form the fill layer, use is made of a dispersion of nanoparticles of $SnO_2$:Sb (ATO) (for example, 50% of ATO particles in water) to cover the strands. The dispersion may optionally be diluted in water before its deposition, for example by spin-coating, as a function of the desired thickness. It is a question, for example, of depositing the dispersion known as Nanotek S1200W sold by Alfa Aesar having a pH~3, a dispersion which is diluted 2:1 (by weight) in deionized water.

The thickness of the layer is for example 1.5 μm (for a strand thickness of 1 μm). The $T_L$ of the thus coated substrate is greater than 80%. By way of illustration, the resistivity varies from 3.5 to 9.2 Ω·cm for thicknesses between 0.45 and 2.3 μm.

Figure 3B:
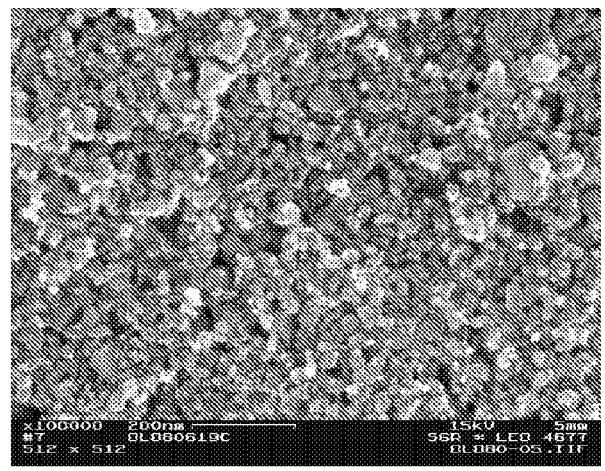
FIGS. 3b and 3c are SEM photos of the surface of the fill material.

FIG. 3b is an SEM photo of the surface of the fill material. The rms is 28 nm and the "peak to valley" height is around 200 nm.

To smooth this surface, a sol-gel layer of $SnO_2$:Sb based on $SnCl_2$ and $SbCl_3$ precursors and having a thickness of 200 nm is deposited, for example by spin coating. A heat treatment is carried out at 500° C. for 1 h to consolidate the layer and obtain crystallization and electroconductivity.

One procedure is described in detail in the publication: "Sb-doped $SnO_2$ transparent conducting oxide from the sol-gel dip-coating technique" by C Terrier et al., Thin solid films 263 (1995) 37-41.

One procedure is also described in detail in the publication "Wet chemical deposition of ATO and ITO coatings using crystalline nanoparticles redispersable in solutions", Thin solid films 351 (1999) 79. Gebbert et al, present the synthesis of nanoparticles of ATO (and of ITO), then their deposition to produce TCO layers having a thickness greater than 500 nm. The nanoparticles are not associated with a binder and the deposition is heat-treated at 550° C.

The sol-gel layer penetrates at least over the outer part of the fill material. By penetrating between the nanoparticles, it thus acts as a binder, which has the result of reinforcing the mechanical strength of the fill layer.

One part of this sol-gel layer covers the nanoparticles, thus forming the electroconductive coating, giving a smoothed electrode surface. The rms of the surface may thus be decreased, for example less than or equal to 5 nm.

The "peak to valley" height may be also be decreased, for example less than or equal to 20 nm.

If necessary, for example to reduce the thickness of the sol-gel layer, a thin conductive polymer smoothing layer, for example a PEDOT layer, is added for example having a thickness of around 20 nm.

The $T_L$ of the coated substrate remains greater than 80%.

By way of illustration, the formulation of $SnO_2$:Sb based on $SnCl_2$ and $SbCl_3$ organometallic precursors in an alcoholic medium is specified here. The synthesis of the $SnO_2$:Sb sol is carried out in 2 steps.

In a first step, 18 g of 5 $nCl_2.2H_2O$ and 90 g of absolute ethanol are mixed in a 250 ml round-bottomed flask. The mixture is heated at 60° C. under reflux and with stirring. The ethanol is then evaporated, with the flask open, at 80° C. while stirring (the operation lasts several hours). A white powder is obtained ($SnCl_2$).

In a second step, to form an $SnO_2$:Sb sol (with Sb/Sn=7.4%) the following are mixed in a flask:
1.01 g of the $SnCl_2$ powder ($0.532 \times 10^{-2}$ mol),
0.09 g of $SbCl_3$ ($3.94 \times 10^{-2}$ mol),
12 g of absolute ethanol.

The mixture is then stirred for 2 h at 50° C., then cooled.

The evaporation of the ethanol is carried out with stirring, until the solvent has completely evaporated. This step takes several hours. This step may be shortened by vacuum evaporation.

As a first variant of this Example 2a, a sol-gel layer based on ZnO:Al is chosen as an electroconductive coating.

A sol-gel layer of ZnO:Al based on $Zn(CH3COO)_2$ and $AlCl_3$ precursors is deposited by spin-coating. A heat treatment is carried out at 550° C. for 2 h to consolidate the layer. It is preferred to carry out the heat treatment in a reducing atmosphere under $N_2$ under $N_2$ and hydrogen (for example, 5%) for a better electrical conductivity.

Besides aluminium, other dopants may be chosen, such as: indium, yttrium, boron and zirconium.

For indium, procedures are described in detail in the publications:

"Transparent conducting ZnO:Al, In and Sn thin films deposited by the sol-gel method", Thin solid films 426 (2003) 94;

"Electrical and optical properties of $In_2O$—ZnO thin films prepared by sol-gel method", Thin solid films 484 (2005) 184;

"Indium-doped ZnO thin films deposited by the sol-gel technique", Thin solid films 490 (2005) 132; and "Preparation and characterisation of IZO transparent conducting films by sol-gel method", Materials Science Forum 449-452 (2004) 469.

For yttrium, procedures are described in detail in the publications

"Sol-gel derived highly transparent and conducting yttrium doped ZnO films", J. of Non Cryst. Solids 352 (2006) 1335"; and "Development of highly transparent and conducting yttrium-doped ZnO films: the role of sol-gel stabilizers", Materials Science-Poland 22, (2004) 201".

For boron, procedures are described in detail in the publication "Boron doped zinc oxide thin films prepared by sol-gel technique", J. of. Mat. Science 40 (2005) 5285.

For zirconium, procedures are described in detail in the publication "Structural, optical and electrical studies on sol-gel deposited Zr doped ZnO films", Materials Chemistry and Physics 79 (2003) 71.

The ZnO:Al layer is however produced with less toxic precursors (zinc acetate and aluminium chloride, in the presence of a complexing agent).

By way of illustration, the base formulation of organometallic precursors in an alcoholic medium is specified here:

For 50 ml of solution:
preparation of the solvent with 48.9 ml of 2-methoxyisopropanol or MIPA (45.08 g)+1.058 ml of MEA (ethanolamine, 1.069 g);
addition of 3.84 g of $Zn(CH_3COO)_2.2H_2O$ ($1.75 \times 10^{-2}$ mol) and of
0.042 g of $AlCl_3.6H_2O$ ($1.75 \times 10^{-4}$ mol);
stirring for 2 h at 60° C., then cooling;
deposition.
One has:
$[Zn(CH_3COO)_2.2H_2O]$=0.35M
Zn/MEA=1
Al/Zn=0.01.

A similar synthesis is described in the article "Transparent conducting ZnO:Al, In and Sn thin films deposited by the sol-gel method" by Jin-Hong Lee, Byung-Ok Part et al., (Thin solid films 426 (2003) 94-99). However, 2-methoxyethanol is replaced by MIPA.

For the fill layer, it is also possible to use a product of ZnO:Al nanoparticles not in dispersion but in the form of a powder sold by Umicore, a powder to be mixed, for example, with a binder of sol-gel type, for example ZnO:Al, as mentioned before, or a suitable organic binder.

As a second variant of the Example 2a, it is also possible to insert nanoparticles of $SnO_2$:Sb into a sol, for example based on $SnCl_2$/$SbCl_3$ precursors.

A water-based dispersion is unstable in the presence of the ethanol contained in the sol. Therefore, it is ensured that the two solutions are compatible by choosing, for example, a dispersion based on a compatible solvent (alcohol, etc.).

EXAMPLE 2B

In a second variant of Example 2, in order to form the fill layer, a dispersion of nanoparticles of $SnO_2$: I (ITO) (30% by weight) in a binder, forming a lacquer, is deposited until the strands are covered. The lacquer may be diluted in ethanol or diacetone alcohol. This may for example be the lacquer called VP Adnano ITO LTH sold by EVONIK having a pH~7, which is diluted 2:1 (by weight) in ethanol.

After deposition by spin coating, or as a variant by screen printing, the layer is consolidated at 120° C. for 1 h and preferably at 220° C., for example for 30 min, in order to improve the conductivity.

Alternatively, it is also possible to use the dispersion called VP Adnano ITO LUV1 sold by Evonik (6% by weight of ITO nanoparticles).

Alternatively, it is also possible to use a colourless ink having an ITO sol-gel precursor, without a toxic or polluting heavy solvent, namely the ink RBnano-ITO from the company RBnano. The deposition may be carried out by sputtering, ink roller pad coating or dip coating. The drying is rapid, in air. The ink is baked between 400° C. and 600° C.

Alternatively, it is possible to use a dispersion of $SnO_2$:I (ITO) nanoparticles. This is for example the dispersion called VP Adnano ITO TC8 DE sold by Evonik with 20% by weight of nanoparticles in ethanol. After deposition, a heat treatment in air may be carried out.

Other products sold by Evonik are:
VP Adnano ITO TC8, containing 100% ITO;
VP Adnano ITO TC8 DW, containing 20% ITO, ITO in water;
VP Adnano ITO TC8 DPPH, containing 40% ITO, ITO in Dowanol™ PPH (propylene glycol phenyl ether);
VP Adnano ITO TC8 DMEK, containing 40% ITO, ITO in methyl ethyl ketone;
VP Adnano ITO TC8 DIPA, containing 40% ITO, ITO in isopropanol.

In the publication "Synthesis and characterisation of ITO nanoparticles", Current Applied Physics 6 (2006), 1044, Jang et al. obtained a layer 1 μm in thickness deposited by dip coating using nanoparticles 8 to 15 nm in thickness that are dispersed at 10% by weight in a polymer binder.

In the publication "Conducting, Antistatic and Antistatic-Antiglare Coatings made with hybrid sols", Mol. Cryst. Liq. Cryst. 374 (2002), 91, Al-Dahoudi et al. produced layers 500 nm to 1 μm in thickness by spin coating and spray coating respectively using 15 nm nanoparticles dispersed in an amount of 25% by weight in an organosilane (epoxy or methacryloxypropyl-triethoxysilane) and binder.

The thickness of the lacquer-based fill layer is 1.5 μm (for a strand thickness of 1 μm). A smaller thickness is however conceivable by changing the dilution of the Evonik LTH lacquer in ethanol or by modifying the deposition parameters (for example, a higher rate of deposition by spin coating).

The $T_L$ of the substrate thus coated is greater than 80%. The resistivity is from 1 to 2 Ω·cm.

Figure 3C:
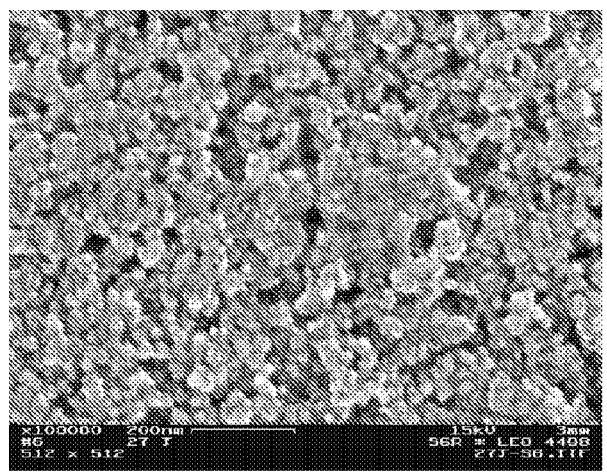

FIG. 3c shows the surface of the fill material. The ITO layer produced from the Evonik LTH lacquer consists of the agglomeration of nanoparticles. The nanoparticles can be clearly seen on the surface. The zone of the layer located above a microgrid strand may be slightly raised.

The aggregates of nanoparticles present on the surface cause roughness that we have measured by AFM.

The rms roughness measured is about 15 nm for a deposit on a microgrid with a peak-to-valley height of the order of 100 nm.

The layer of ITO nanoparticles is sufficiently conducting and does not modify the conductivity of the microgrid. The measured R☐ remains unchanged.

To evaluate the mechanical strength of the ITO-based conducting layer, we carried out an adhesive-tape tear test (the adhesive tape being 51108 sold by Tecmatel). A flattening of the surface of the layer is observed: the nanoparticle aggregates seem compressed. No tearing of the layer is however observed.

This transparent ITO-based layer meets the specification in terms of thickness, electrical conductivity and mechanical strength.

As electroconductive coating, it is possible to choose (at least) a PEDOT layer with a thickness of about 100 nm. The PEDOT polymer may then make it possible to reduce the rms roughness of the conducting layer to 5 nm or less, and the peak-to-valley height to a value of less than or equal to 20 nm.

It is also possible to form an electroconductive coating comprising a sol-gel layer, for example of ITO, by synthesis based on indium (III) acetate or indium (III) chloride tetrahydrate precursors.

EXAMPLE 3

Figure 4:
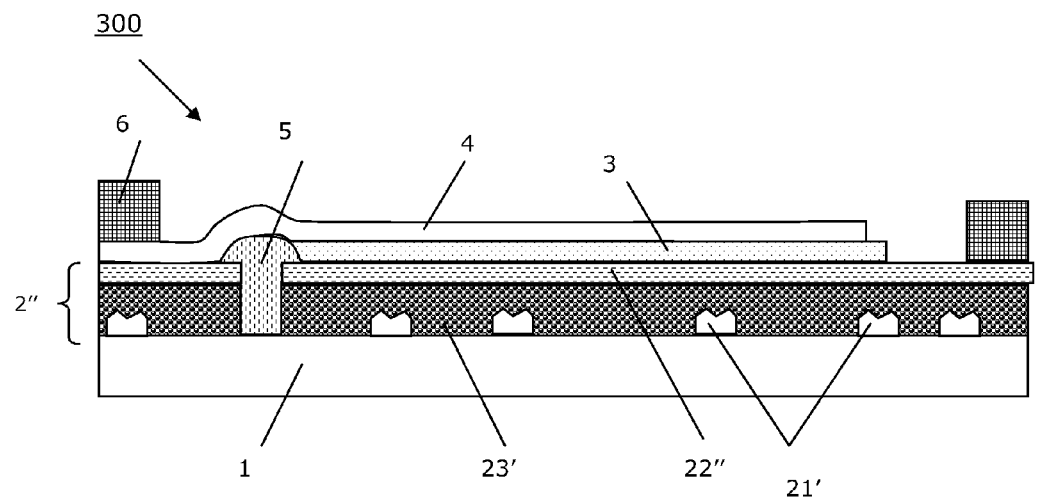
FIG. 4 is a schematic cross-sectional view of a third organic light-emitting device, which comprises a composite lower electrode according to a third embodiment of the invention.

FIG. 4 shows a sectional view of an organic light-emitting device 300, which comprises a composite electrode 2". Only the modifications compared to the device 100 will be detailed below.

The network 21' is less dense, with strands having an average width A of the order of 10 μm, the average spacing between the strands B being of the order of 100 μm.

To improve the extraction of the guided modes in the organic layers 3, the space between the strands is filled with a diffusing fill layer 23' formed for example from ITO electroconductive particles 150 nm in size optionally dispersed in a binder, for example an acrylic resin, or in a mineral binder, which is also possibly electroconductive. This layer may for example be screen-printed. This electroconductive layer 23' has a resistivity ρ2 chosen to be greater than the resistivity ρ1, typically between $10^{-1}$ and 10 Ω·cm.

To simplify the fabrication, its thickness is greater than that of the network 22, for example equal to 4 μm, the fill layer 23' then covering the network 21'.

The electroconductive coating 22", is an ITO sol-gel layer deposited for example by dip coating or by spray coating, with a thickness of the order of 200 nm or even less (for example 150 nm). The electroconductive coating 22" then completes the smoothing. It resistivity ρ1 is of the order of $10^{-2}$ Ω·cm.

It is for example possible to use the product called DX-400® sold by the company Sumitomo Metal Mining Co. Ltd. This is a paste based on tin and indium alkoxides, an organic solvent and a viscosity control agent.

EXAMPLE 4

Figure 5:
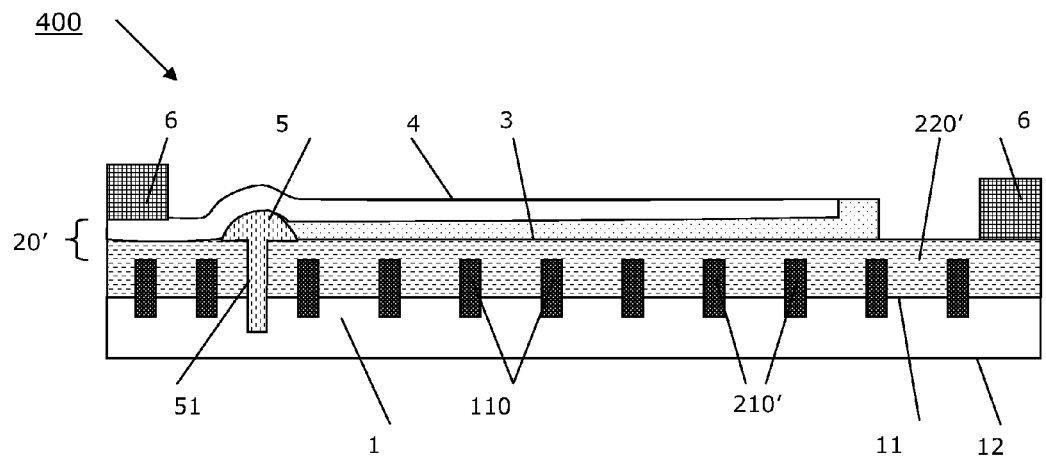
FIG. 5 is a schematic cross-sectional view of a fourth organic light-emitting device, which comprises a composite lower electrode according to a fourth embodiment of the invention.

FIG. 5 shows a sectional view of an organic light-emitting device 400 which includes a composite electrode 20'. Only the modifications relative to the device 100 will be detailed below.

The electroconductive network 210' of thickness 1 μm is partly in an etching network 110 of the glass 1, with a thickness of 50 nm.

A cracked sol-gel mask on the glass, for example based on a hybrid or non-hybrid silica, is used. The substrate undergoes wet etching with an HF solution. However, it is preferred to use a mask with self-organized openings, already described in Example 1 (and explained in detail later) and the substrate is etched by a fluorine plasma.

The material of the network is deposited while keeping the sol-gel mask or the nanoparticle-based mask, the deposition being carried out through the cracks. Preferably, vacuum deposition is chosen, for example deposition of silver by evaporation, or else deposition of ITO or IZO by sputtering optionally followed by electroplating of copper and/or electroplating of nickel or chromium. It is also possible to choose a liquid route, for example using a doctor blade with a silver ink. The thickness of the deposit may be controlled, preferably so as to fill the etched zones entirely. The electroconductive coating 220' may for example be PEDOT/PSS deposited by a liquid route with a thickness from 1.5 μm upwards.

Care is taken to ensure that the longitudinal etching 51 for the connections is deeper than the etching network 110.

In all the examples, the external surface of the coating is such that, starting from an actual profile of the external surface over the average period of the B+A network and by forming a corrected profile by nanoscale filtering in order to remove the local microroughness, what is obtained at every point of the corrected profile is an angle formed by the tangent to the corrected profile with the average plane of the corrected profile of less than or equal to 45°.

Starting from the residual profile formed by the difference between the actual profile and the corrected profile, what is obtained at every point on the corrected profile is a maximum difference in height between the highest point and the lowest point of the residual profile of at least less than 50 nm over the average period of the B+A network.

Fabrication of the Composite Electrode

Given below is an example of the fabrication of the composite electrode employing a mask having a network of self-generated openings in a preferred embodiment.

a) Fabrication of the Mask with Self-Generated Openings

Firstly, the mask with self-generated openings is produced. To do this, a simple emulsion of colloidal particles based on an acrylic copolymer, which are stabilized in water, in a concentration by weight of 40%, is deposited by a liquid route. The colloidal particles have a characteristic size of 80 to 100 nm and are sold by DSM under the brand name Neocryl XK 52.

The so-called masking layer incorporating the colloidal particles is then dried so as to evaporate the solvent. This drying may be carried out by any appropriate method (hot-air drying, etc.).

During this drying step, the system undergoes self-arrangement and describes features according to a structure characterized by the average width of the feature, called hereafter A1, and the average distance between the features, called hereafter B1. This stabilized mask will consequently be defined by the ratio B1/A1. A stable mask is obtained without recourse to annealing.

The B1/A1 ratio may be modified by for example adapting the coefficient of friction between the compacted colloids and the surface of the substrate, or else the size of the nanoparticles, or also the rate of evaporation, or the initial concentration of particles, or the nature of the solvent, or the thickness, depending on the technique of deposition.

To illustrate these various options, an experiment plan with two colloid solution concentrations ($C_0$ and $0.5 \times C_0$) and various thicknesses, deposited by regulating the rate of rise of the specimen, is given below. The solution was deposited by dip coating. It should be pointed out that the B1/A1 ratio may be changed by changing the concentration. The results are given in the following table:

| Concentration by weight | Rate of rise (cm/min) | B1: distance between the features (μm) | A1: width of the features (μm) | B1/A1 ratio |
|---|---|---|---|---|
| 20% | 5 | 25 | 3 | 8.4 |
| 40% | 10 | 40 | 3, 5 | 11.4 |

The colloid solution was also deposited with the concentration $C_0=40\%$ using pull-films of various thicknesses. These experiments show that it is possible to vary the size of the features A1 and the distance between the features B1 by adjusting the initial thickness of the colloid layer. The results are given in the following table:

| Thickness deposited by the pull-film (μm) | % by weight | B1: space between the strands (μm) | A1: width of the strands (μm) | B1/A1 ratio |
|---|---|---|---|---|
| 30 | 40 | 20 | 2 | 10 |
| 120 | 40 | 110 | 10 | 11.1 |

In another embodiment, a simple emulsion of acrylic-copolymer-based colloidal particles stabilized in water with a concentration by weight of 50%, a pH of 3 and a viscosity of 200 mPa·s is deposited. The colloidal particles have a characteristic size of about 118 nm and are sold by DSM under the brand name Neocryl XK 38® and have a Tg of 71° C.

In another embodiment, a 40% solution of silica colloids with a characteristic size of around 10 to 20 nm, for example the product LUDOX® AS 40 sold by Sigma Aldrich, is deposited. The B/A ratio is about 30.

Typically, between 15% and 50% of the silica colloids in an organic (especially aqueous) solvent may for example be deposited.

b) Cleaning of the Mask

The use of a plasma source as source for cleaning the organic particles located at the bottom of the cracks subsequently makes it possible to improve the adhesion of the serving electroconductive material to the network of the electrode.

To give an exemplary embodiment, cleaning with the aid of an atmospheric-pressure plasma source, with a transferred-arc plasma based on an oxygen/helium mixture, makes it possible both to improve the adhesion of the material deposited at the bottom of the interstices and to widen the interstices. A plasma source of the brand "ATOMFLOW" sold by Surfx may be used.

c) Fabrication of the Electroconductive Network

The electroconductive network of the composite electrode according to the invention is produced using this mask. To do this, one or more electroconductive materials are deposited through the mask, until a fraction of the interstices is filled.

As metal, silver or aluminium may preferably be chosen. As conducting oxides, ITO, IZO or IGZO may preferably be chosen.

The average width of the conducting strands A is approximately equal to A1. The average distance between the conducting strands B is approximately equal to B1.

To increase the thickness of the metal layer and thus reduce the electrical resistance of the grid, we deposited, by electrolysis (soluble anode method), a copper overlayer on the silver grid.

The glass optionally covered with the adhesion-promoting underlayer and with the silver grid by magnetron sputtering constitutes the cathode of the experimental device. The anode consists of a copper plate. This has the role, by being dissolved, of keeping the concentration of $Cu^{2+}$ ions constant throughout the deposition process and thus keeping the deposition rate constant.

The electrolysis solution (bath) consists of an aqueous copper sulphate solution ($CuSO_4 \cdot 5H_2O=70$ gl$^{-1}$) to which 50 ml of sulphuric acid (10 $NH_2SO_4$) is added. The temperature of the solution during the electrolysis is 23±2° C.

The deposition conditions are the following: voltage≦1.5 V and current≦1 A.

The anode and the cathode, spaced apart by 3 to 5 cm and of the same size, are positioned parallel to each other so as to obtain perpendicular field lines.

The copper layers are homogeneous on the silver grids. The thickness of the deposit increases with the duration of the electrolysis, with the current density and with the morphology of the deposit. The results are given in the following table.

| Specimen | 500 nm Ag reference | With 0.5 μm Cu | With 1 μm Cu |
|---|---|---|---|
| $T_L$ (%) | 75 | 70 | 66-70 |
| Haze (%) | 2.5 | 3.0 | 3.0 |
| $R_\square$ (Ω) | 3 | 2 | 0.2 | d) Removal of the Mask

To reveal the structure of the network from the mask, a "lift-off" operation is carried out. The colloidal mask is immersed in a solution containing water and acetone (the cleaning solution is chosen according to the nature of the colloidal particles) and then rinsed so as to remove all the parts coated with colloids.

e) Filling and Covering of the Network

The space between the conducting strands is completely filled with a given material, preferably promoting the extraction of the guided modes in the OLED (high-index, diffusing, etc.) layers and being electroconductive, and the network and the fill material are covered with an electroconductive coating, which completes the smoothing and has an electrical role of distributing the current or maintaining a vertical conductivity.

In particular, the space between strands may be filled and smoothed using one and the same slightly electroconductive material, of suitable resistivity, as in Example 1.

It goes without saying that the invention applies in the same manner using organic light-emitting systems other than those described in the examples and using a plastic substrate.

The invention claimed is:

1. A substrate bearing, on one main face, a composite electrode, which comprises:
    an electroconductive network which is a layer formed from strands made of an electroconductive material based on a metal and/or a metal oxide, and having a light transmission of at least 60% at 550 nm, a space between the strands of the network being filled by an electroconductive fill material;
    an electroconductive coating covering the electroconductive network, and in electrical connection with the strands, having a thickness greater than or equal to 40 nm, of resistivity $\rho 1$ less than $10^5$ $\Omega \cdot cm$ and greater than the resistivity of the network, the coating forming a smoothed outer surface of the electrode;
    the fill material being electroconductive with a resistivity $\rho 2$ greater than the resistivity of the network $\rho 0$ and less than the resistivity $\rho 1$, or with a resistivity $\rho 2$ greater than $\rho 1$, having a thickness greater than the thickness of the strands, covering the electroconductive network, the electroconductive coating then covering said fill material,
    or the fill material being made of said electroconductive coating, the electroconductive coating then substantially filling the space between the strands;
    the composite electrode having a sheet resistance less than or equal to 10 $\Omega/\square$.

2. The substrate according to claim 1, wherein the outer surface is such that, starting from an actual profile of the outer surface over the average period of the network B+A and by forming a corrected profile by nanoscale filtering to eliminate the local microroughness, an angle formed by the tangent to the corrected profile with the average plane of the corrected profile is obtained that is less than or equal to 45°, at any point of the corrected profile, and wherein, starting from the residual profile formed by the difference between the actual profile and the corrected profile, a maximum altitude difference between the highest point and the lowest point of the residual profile that is less than 50 nm, at any point of the corrected profile, over the average period of the network B+A is obtained.

3. The substrate according to claim 2, wherein the outer surface is such that, starting from the residual profile formed by the difference between the actual profile and the corrected profile, a maximum altitude difference between the highest point and the lowest point of the residual profile that is less than 20 nm, at any point of the corrected profile, over the average period of the network B+A is obtained, and/or an rms less than or equal to 5 nm over the average period of the network B+A is obtained.

4. The substrate according to claim 1, wherein the B/A ratio between the average distance B between the strands and the average width of the strands A is between 5 and 15.

5. The substrate according to claim 4, wherein the average width of the strands A is between 100 nm and 30 µm and the average distance between the strands B is between 5 µm and 300 µm.

6. The substrate according to claim 1, wherein the network is formed of the strands arranged in a grid.

7. The substrate according to claim 6, wherein the grid is an irregular grid.

8. The substrate according to claim 1, wherein the network has a thickness between 100 µm and 5 µm.

9. The substrate according to claim 8, wherein the network has a thickness between 0.5 and 3 µm.

10. The substrate according to claim 1, wherein the electroconductive coating comprises, or is composed of, a layer, mainly based on one or more transparent conductive oxides.

11. The substrate according to claim 10, wherein the layer of the electroconductive coating is based on single tin oxide, zinc oxide or indium oxide, optionally doped and/or mixed.

12. The substrate according to claim 1, wherein the electroconductive coating comprises, or is composed of, a layer of one or more conductive metal oxides obtained via a sol-gel route based on organometallic precursors.

13. The substrate according to claim 1, wherein the electroconductive coating comprises, or is composed of, an essentially polymer layer.

14. The substrate according to claim 13, wherein the polymer layer includes one or more polymers from at least one of the following familes: poly(acetylene)s, poly(thiophene)s, poly(pyrrole)s, poly(aniline)s, poly(fluorene)s, poly(3-alkyl thiophene)s, polytetrathiafulvalenes, polynaphthalenes, poly (p-phenylene sulphide) and poly(para-phenylene vinylene)s.

15. The substrate according to claim 14, wherein the polymer layer includes poly(3,4-ethylenedioxythiophene).

16. The substrate according to claim 1, wherein the electroconductive fill material forms an electroconductive fill layer that comprises, or is composed of, a layer based on metal nanoparticles.

17. The substrate according to claim 16, wherein the electroconductive fill layer is, at least for its outer part furthest from the substrate, in a binder.

18. The substrate according to claim 17, wherein the binder is a sol-gel binder.

19. The substrate according to claim 17, wherein the binder is a sol-gen binder.

20. The substrate according to claim 19, wherein the binder is a binder of one or more conductive oxides including at least one of the following doped or mixed metal oxides:
    zince oxide doped or alloyed with at least one of the following elements: aluminum, gallium, indium, boron, tin, yttrium, zirconium;
    indium oxide doped or alloyed with zinc, gallium and zing, tin;
    tin oxide doped with fluorine or with antimony or alloyed with zinc optionally doped with antimony;
    titanium oxide doped with niobium.

21. The substrate according to claim 16, wherein the electroconductive fill layer is composed of a layer based on nanoparticles of one or more conductive metal oxides and the electroconductive coating comprises, or is composed of, an electroconductive sol-gel layer.

22. The substrate according to claim 16, wherein the electroconductive fill layer is composed of a layer based on nanoparticles of one or more conductive metal oxides, which is in a polymer binder, at least in its outermost part, and the electroconductiw coating comprises, or is composed of, an essentially polymer electroconductive layer compatible with or identical to the binder, the surface of which is the smoothed electrode surface, of one or more polymers from at least one of the following families: poly(acetylene)s, poly(thiophene)s, poly(pyrrole)s, poly(aniline)s, poly(fluorene)s, poly(3-alkyl thiophene)s, polytetrathiafulvalenes, polynaphthalenes, poly(p-phenylene sulphide) and poly(para-phenylene vinylene)s.

23. The substrate according to claim 1, wherein the fill material is made of the material of the coating, and the thickness of the coating between the strands is at least one and a half times greater than the height of the strands.

24. The substrate according to claim 1, wherein the electroconductive fill material has a refractive index greater than or equal to 1.65 at 550 nm, and wherein a distance B between strands is less than or equal to 50 µm, and the strands are preferably based on a metal.

25. The substrate according to claim 24, wherein the metal is silver or aluminum.

26. The substrate according to claim 1, wherein the electroconductive fill material is diffusing.

27. The substrate according to claim 1, wherein the substrate is a glass substrate and the electroconductive network is partially in an etching network of the glass substrate.

28. The substrate according to claim 1, wherein the electroconductive network comprises a layer based on a pure metallic material chosen from silver, aluminum, copper, palladium, chromium, platinum or gold, or based on said pure metallic material allied or doped with at least one other material chosen from: Ag, Au, Pd, Al, Pt, Cu, Zn, Cd, In, Si, Zr, Mo, Ni, Cr, Mg, Mn, Co, Sn.

29. The substrate according to claim 1, wherein the electroconductive network comprises an electroconductive overlayer for protection against corrosion, chosen from a metal, or from transparent conductive oxides.

30. The substrate according to claim 29, wherein the metal is nickel, chromium, molybdenum or any mixture thereof.

31. The substrate according to claim 1, wherein said substrate is a glass substrate.

32. The substrate according to claim 1, comprising an organic light-emitting system deposited directly on the outer surface of the electrode.

33. An organic light-emitting device incorporating a substrate according to claim 1, the composite electrode forming a lower electrode closest to the substrate.

34. The organic light-emitting device according to claim 33, wherein the organic light-emitting device forms one or more transparent and/or reflective luminous surfaces.

35. The organic light-emitting device according to claim 33, wherein the organic light emitting device is configured to be used:
   for a building;
   for a transport vehicle;
   for urban or professional furniture;
   for an interior furnishing;
   for the backlighting of electronic equipment; or
   as an illuminating mirror.

36. A process for fabricating the composite electrode on the substrate according to claim 1, comprising:
   directly forming the network arrangement of the conductor, the forming comprising at least one of the following depositions:
      a deposition of the electroconductive material of the network via a stamp pad;
      deposition via conductive ink-jet printing onto the substrate,
   depositing the electroconductive coating via a liquid route.

37. The process for fabricating the composite electrode according to claim 36, wherein, before depositing the electroconductive coating, the process comprises:
   filling the space between strands with at least one of the following electroconductive fill materials: a high-index material or a diffusing material;
   removing the mask optionally present until said electroconductive network is revealed, preceding the filling.

38. The process for fabricating the composite electrode according to claim 37, wherein said filling is performed via a liquid route.

39. The process for fabricating the composite electrode according to claim 37, wherein the filling includes depositing a dispersion of electroconductive (nano)particles, which is mainly binder-free, and an electroconductive binder of the (nano)particles, the binder penetrating into the layer of (nano)particles and forming the electroconductive coating that covers the (nano)particles.

40. The process for fabricating the composite electrode according to claim 36, wherein during the depositing of the electroconductive coating, the space between strands is substantially completely filled with the electroconductive coating.

41. A process for fabricating the composite electrode on the substrate according to claim 1, comprising:
   directly forming the network arrangement of the conductor, comprising at least one deposition of the electroconductive material of the network through one mask on the substrate with openings self-organized as a network, until a fraction of the depth of the openings has been filled;
   optionally, before the forming, etching the substrate through the openings of the mask, thus partially anchoring the network to the substrate;
   removing the mask; and
   depositing the electroconductive coating via a liquid route.

42. The process for fabricating the composite electrode according to claim 41, comprising forming the mask, said forming the mask comprising:
   depositing onto the substrate of a masking layer;
   curing the masking layer or drying the liquid masking layer until the network openings that form said mask are obtained.

43. The process for fabricating the composite electrode according to claim 42, wherein the masking layer is a solution of colloidal particles that are stabilized and dispersed in a solvent.

44. The process for fabricating the composite electrode according to claim 43, wherein the masking layer is a solution of colloidal particles that are stabilized and dispersed in a solvent.

45. The process for fabricating the composite electrode according to claim 36, wherein the deposition of the electroconductive material of the network onto the mask and optionally partly onto the subjacent etching network comprises a non-selective deposition, or a deposition via a liquid route, including by printing, by blade coating with a conductive ink, by dip coating, or by spray coating, the deposition optionally completed by an electrolytic recharge by a metal and/or by an overlayer for protection against corrosion.

46. The substrate according to claim 1, wherein the electroconductive coating comprises a layer based on a metal.

47. The substrate according to claim 1, wherein the electroconductive fill material forms an electroconductive fill layer that comprises, or is composed of, a layer based on nanoparticles of one or more conductive oxides.

* * * * *

UNITED STATES PATENT AND TRADEMARK OFFICE
CERTIFICATE OF CORRECTION

PATENT NO. : 8,362,686 B2
APPLICATION NO. : 12/744191
DATED : January 29, 2013
INVENTOR(S) : Svetoslav Tchakarov et al.

It is certified that error appears in the above-identified patent and that said Letters Patent is hereby corrected as shown below:

Column 34, line 44
  replace "sol-gen"
  with -- sol-gel --

Column 34, line 48
  replace "zince oxide"
  with -- zinc oxide --

Column 34, line 51
  replace "zing"
  with -- zinc --

Column 34, lines 64 and 65
  replace "electroconductiw"
  with -- electroconductive --

Column 35, line 15
  replace "preferably based"
  with -- based --

Column 36, line 25
  replace "one mask"
  with -- a mask --

Signed and Sealed this
Twelfth Day of March, 2013

Teresa Stanek Rea
*Acting Director of the United States Patent and Trademark Office*